US012543343B2

(12) United States Patent
Li et al.

(10) Patent No.: US 12,543,343 B2
(45) Date of Patent: Feb. 3, 2026

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Wei-Jin Li, Hsinchu (TW); Che-Hao Chang, Hsinchu (TW); Chi On Chui, Hsinchu (TW); Yung-Cheng Lu, Hsinchu (TW); Wen-Kai Lin, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 890 days.

(21) Appl. No.: 17/655,208

(22) Filed: Mar. 17, 2022

(65) Prior Publication Data

US 2023/0117574 A1   Apr. 20, 2023

Related U.S. Application Data

(60) Provisional application No. 63/257,155, filed on Oct. 19, 2021.

(51) Int. Cl.
| | |
|---|---|
| H10D 30/67 | (2025.01) |
| H10D 30/01 | (2025.01) |
| H10D 62/10 | (2025.01) |
| H10D 64/01 | (2025.01) |
| H10D 84/01 | (2025.01) |
| H10D 84/03 | (2025.01) |
| H10D 84/83 | (2025.01) |

(52) U.S. Cl.
CPC ....... *H10D 30/6713* (2025.01); *H10D 30/031* (2025.01); *H10D 30/6735* (2025.01); *H10D 62/118* (2025.01); *H10D 64/017* (2025.01); *H10D 84/013* (2025.01); *H10D 84/0151* (2025.01); *H10D 84/038* (2025.01); *H10D 84/83* (2025.01)

(58) Field of Classification Search
None
See application file for complete search history.

(56) References Cited

U.S. PATENT DOCUMENTS

| | | | | |
|---|---|---|---|---|
| 2009/0267155 | A1* | 10/2009 | Izumida | H10D 30/751 |
| | | | | 257/E29.085 |
| 2013/0210241 | A1* | 8/2013 | LaVoie | H01L 21/02211 |
| | | | | 257/E21.24 |

(Continued)

FOREIGN PATENT DOCUMENTS

| | | |
|---|---|---|
| TW | 201724500 A | 7/2017 |
| TW | 202129837 A | 8/2021 |

*Primary Examiner* — Hung K Vu
(74) *Attorney, Agent, or Firm* — Slater Matsil, LLP

(57) ABSTRACT

A semiconductor structure and a method of forming is provided. The semiconductor structure includes nanostructures separated from one another and stacked over a substrate, a gate stack wrapping around the nanostructures, and a dielectric fin structure laterally spaced apart from the nanostructures by the gate stack. The dielectric fin structure include a lining layer and a fill layer nested within the lining layer. The lining layer is made of a carbon-containing dielectric material, and a carbon concentration of the lining layer varies in a direction from the gate stack to the lining layer.

20 Claims, 31 Drawing Sheets

(56) References Cited

U.S. PATENT DOCUMENTS

| | | | |
|---|---|---|---|
| 2014/0346612 A1* | 11/2014 | Adam | H10D 30/026 257/397 |
| 2021/0242331 A1 | 8/2021 | You et al. | |
| 2021/0249352 A1 | 8/2021 | Soss et al. | |

* cited by examiner

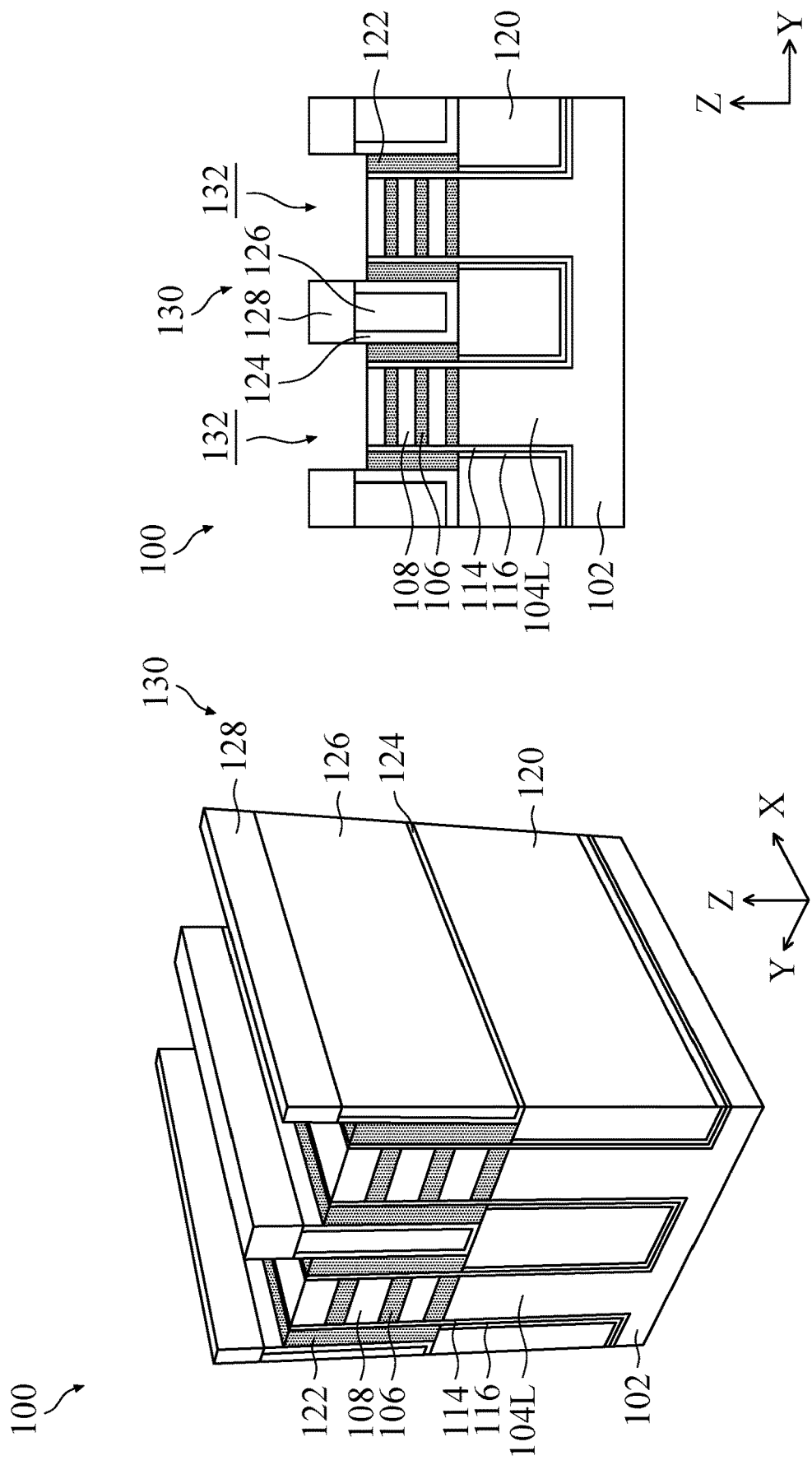

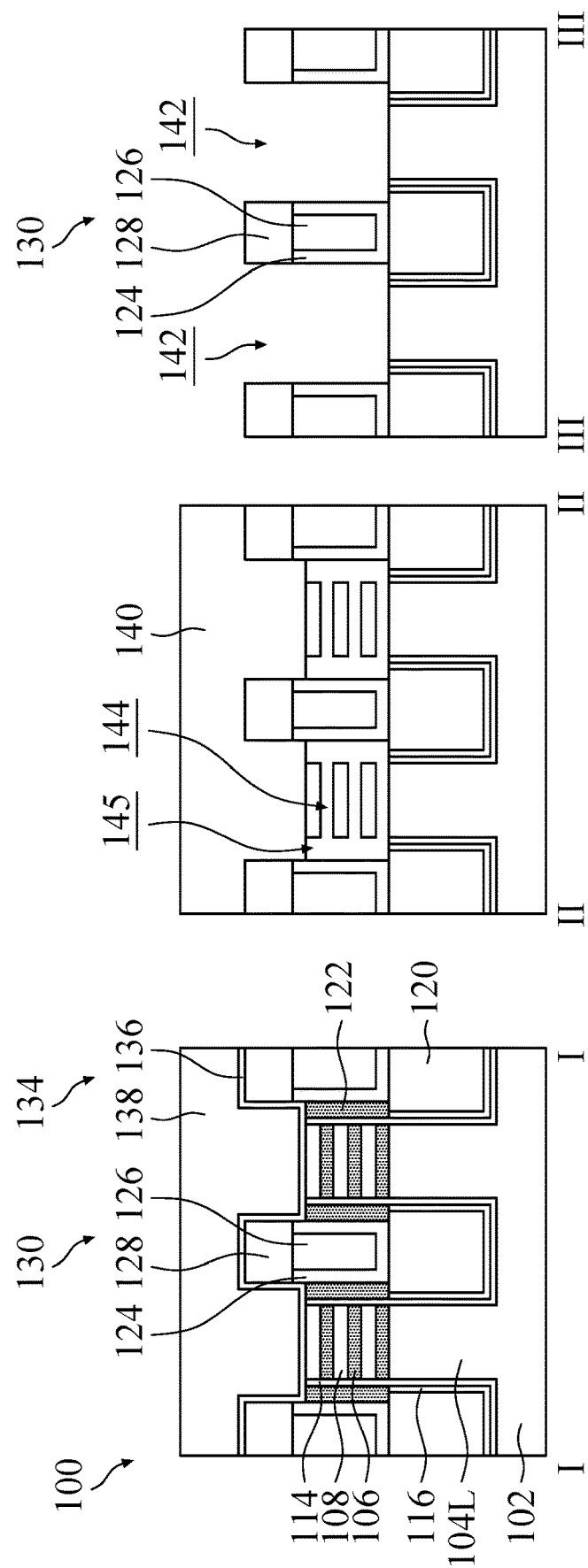

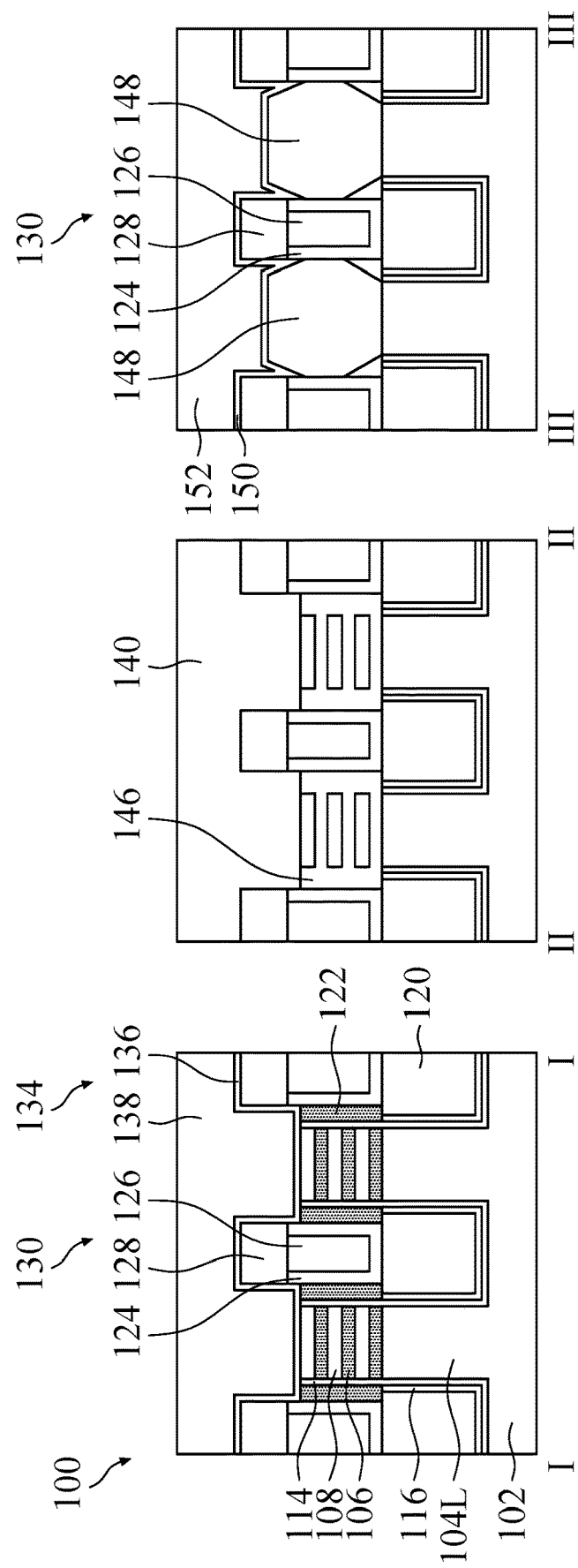

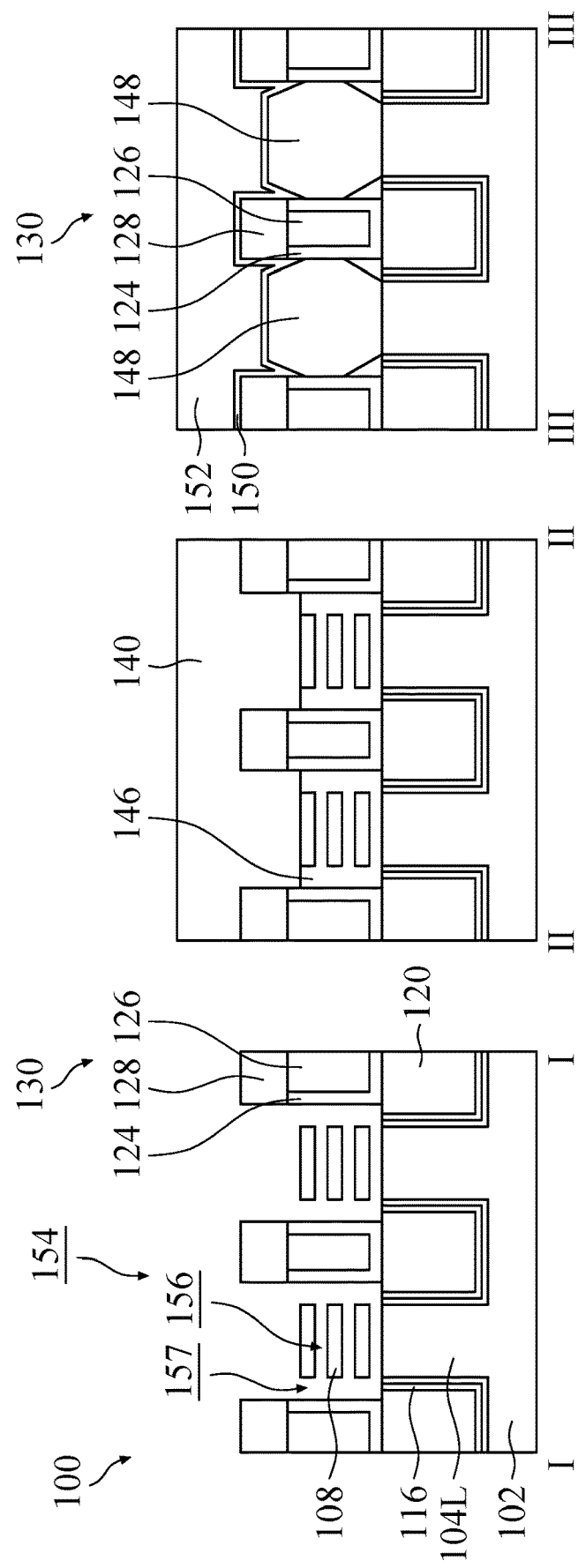

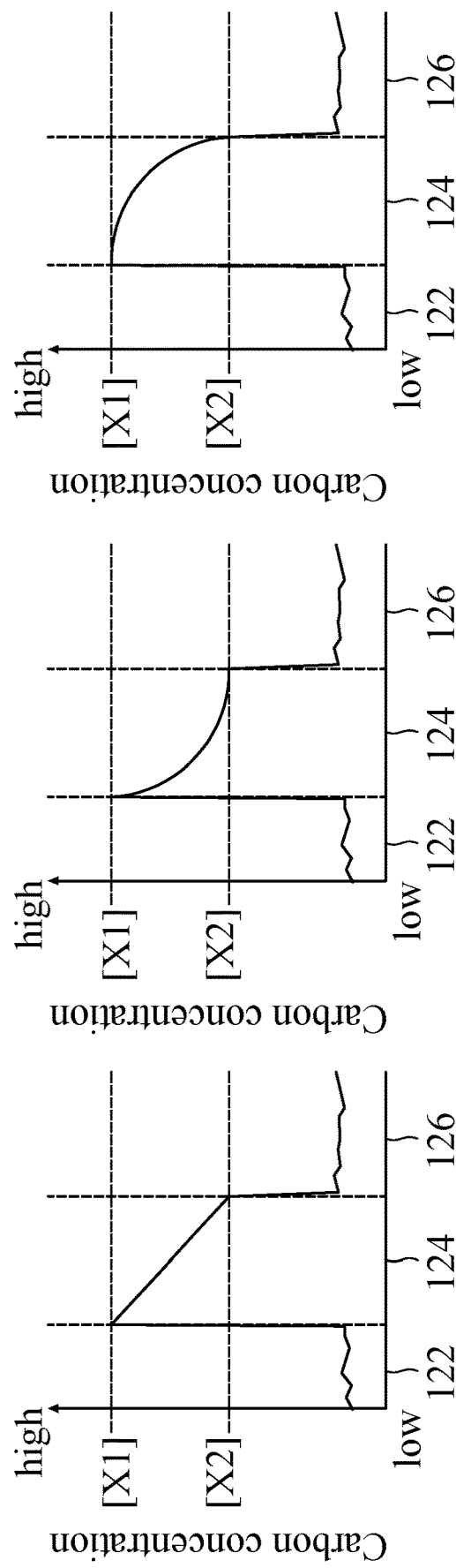

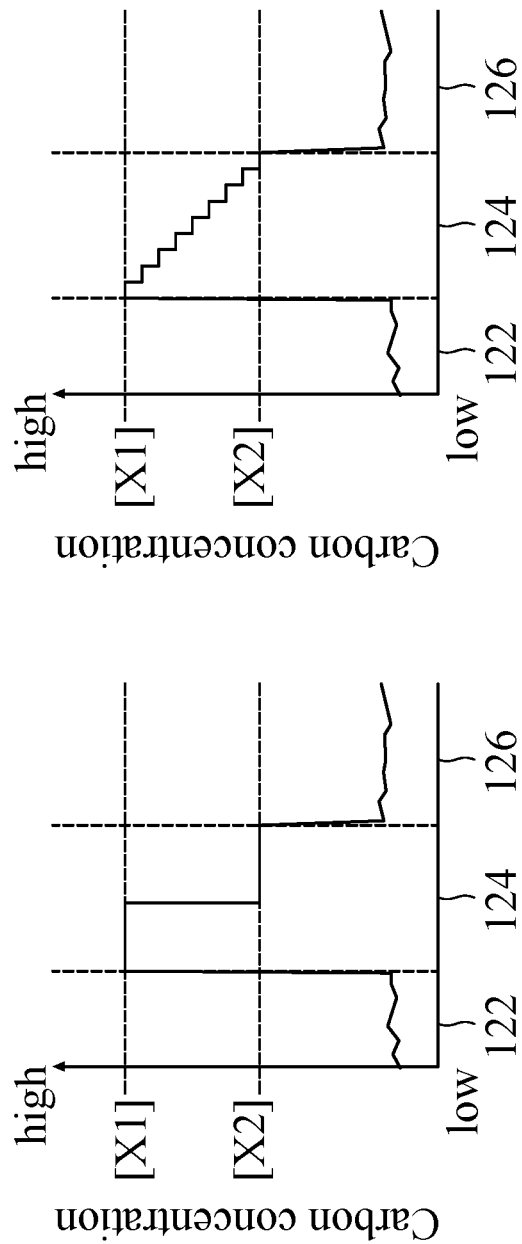

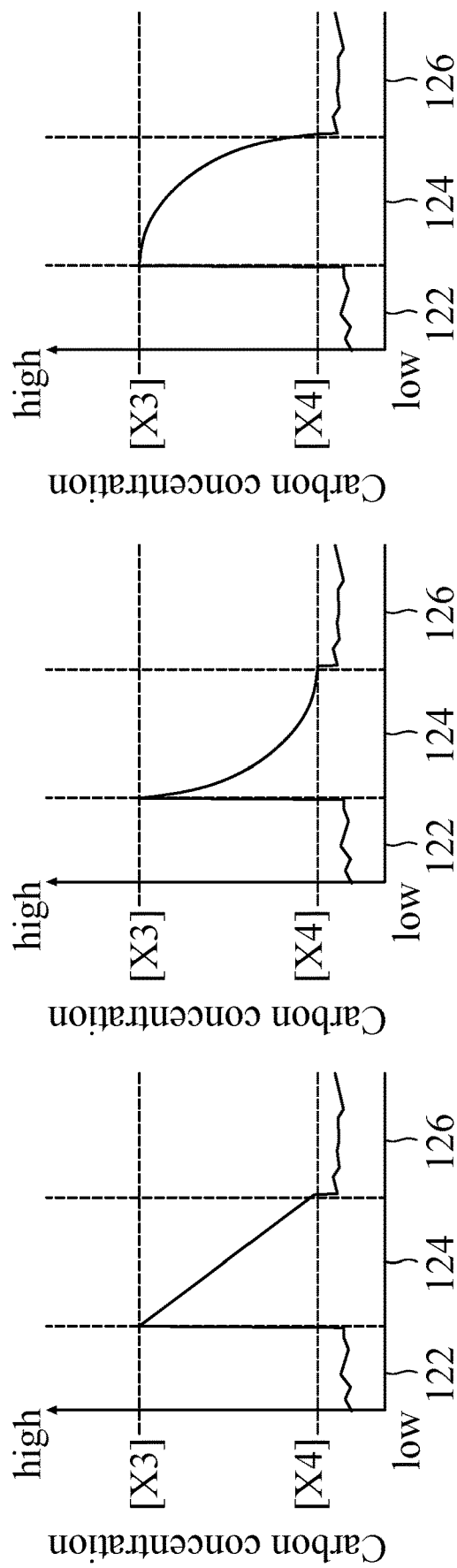

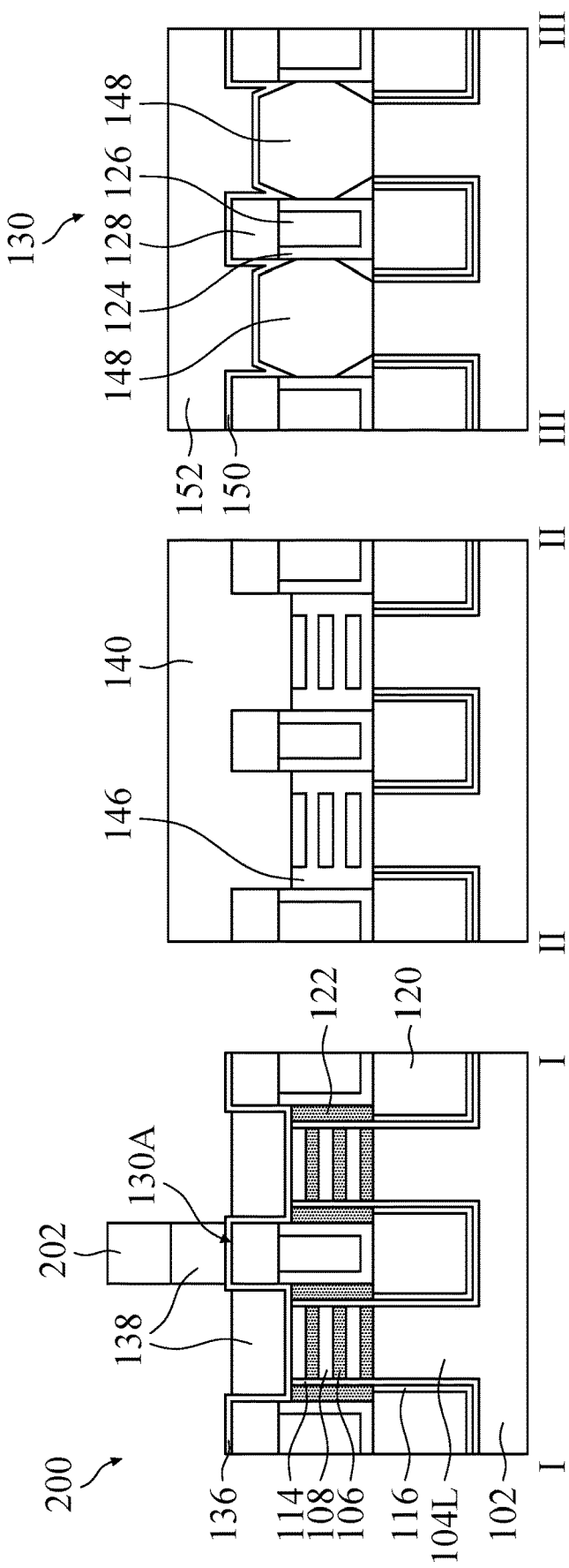

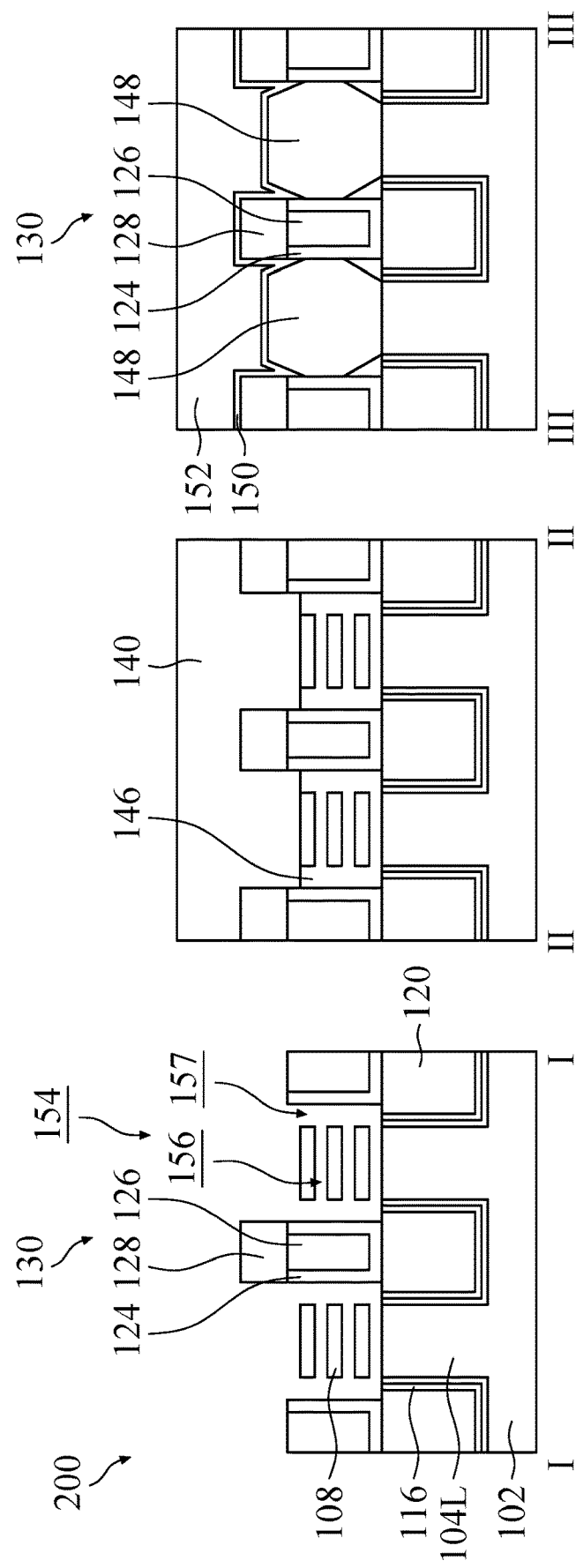

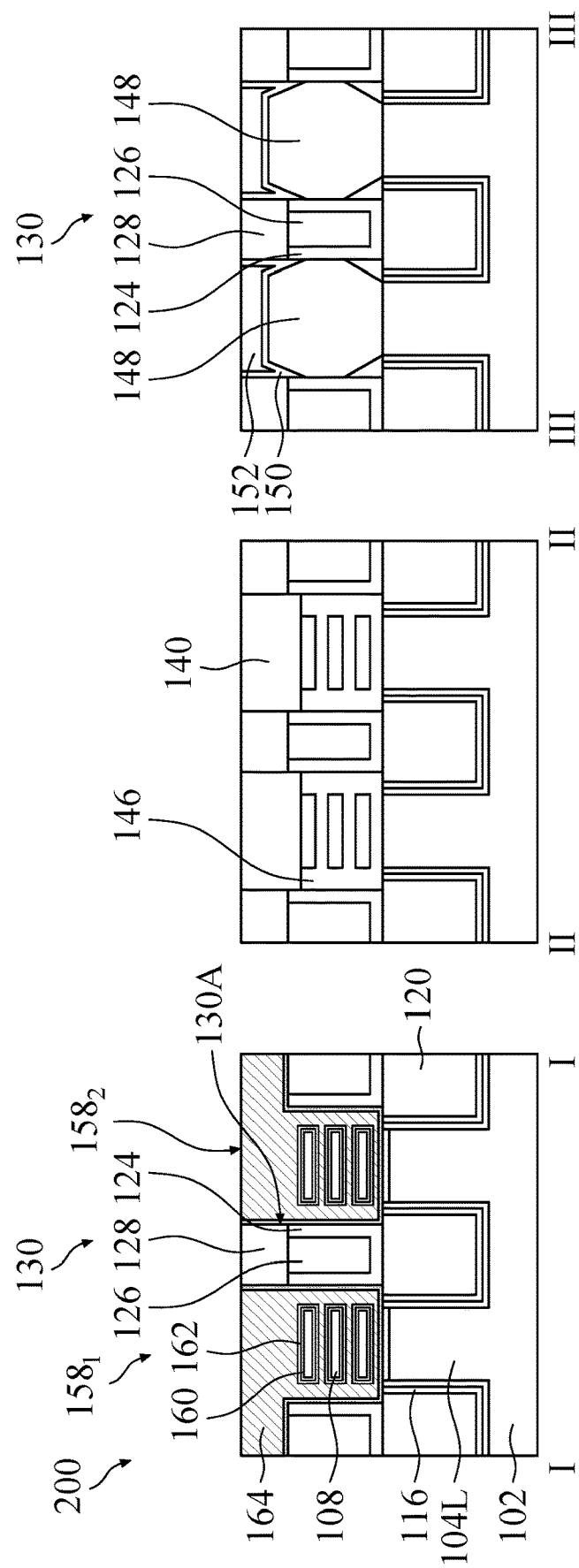

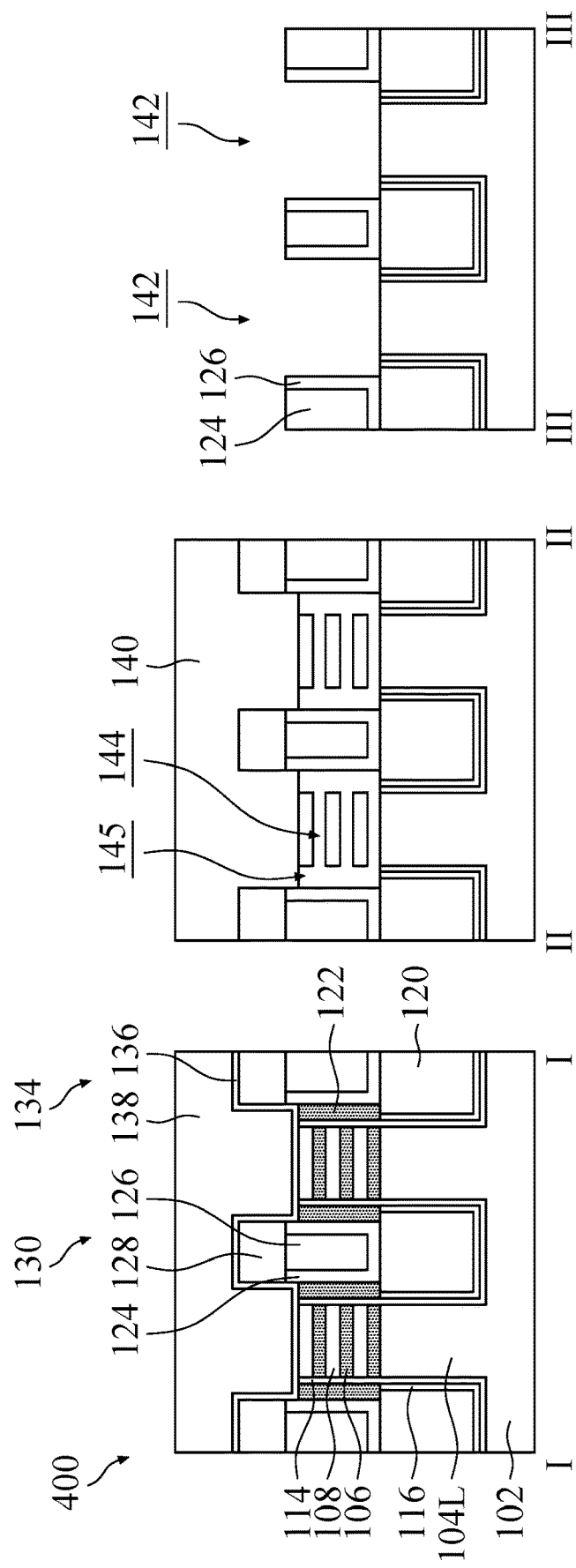

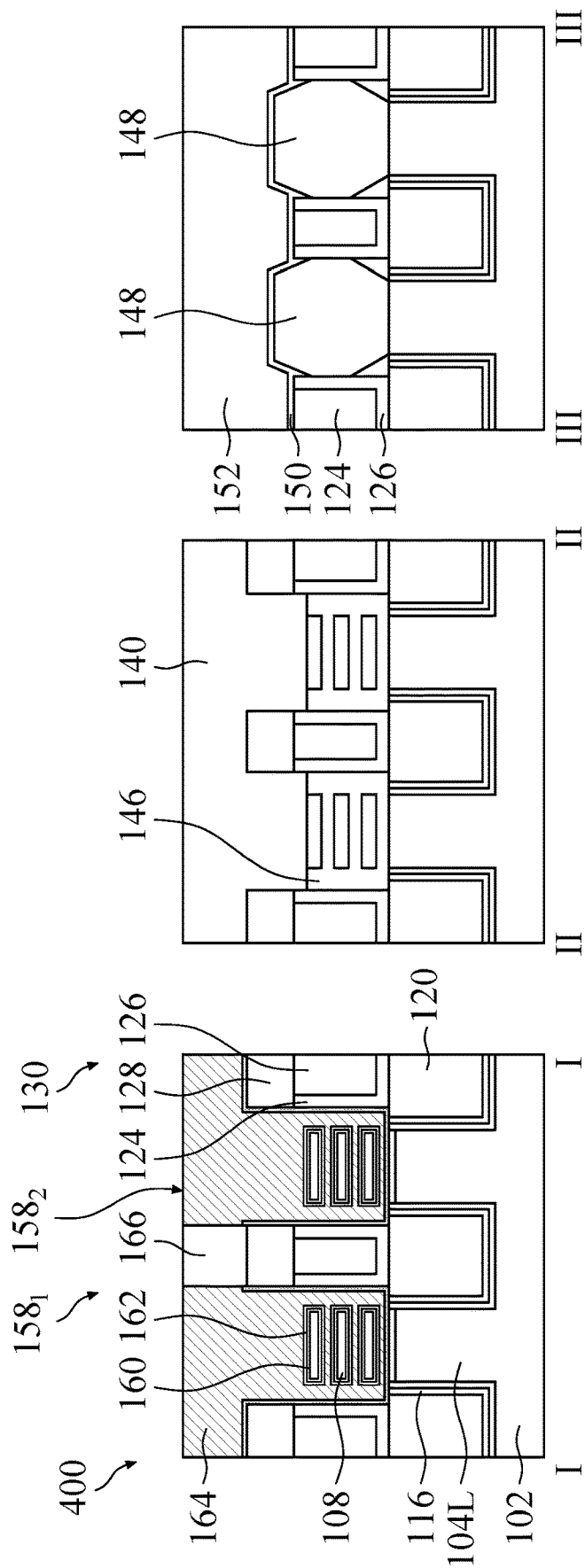

SEMICONDUCTOR STRUCTURE AND METHOD FOR FORMING THE SAME

PRIORITY CLAIM

This application claims the benefit of U.S. Provisional Application No. 63/257,155, filed on Oct. 19, 2021 and entitled "Semiconductor Device with a Dielectric Fin Structure and Method for Forming the Same," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A through 1K are perspective views illustrating the formation of a semiconductor structure at various intermediate stages, in accordance with some embodiments of the disclosure.

FIGS. 1F-1, 1G-1, 1H-1, 1I-1, 1J-1, 1K-1, 1K-2 and 1K-3, 1L-1, 1L-2 and 1L-3, 1M-1, 1M-2 and 1M-3, 1N-1, 1N-2 and 1N-3, 1O-1, 1O-2 and 1O-3, 1P-1, 1P-2 and 1P-3, and 1Q-1, 1Q-2 and 1Q-3 are cross-sectional views illustrating the formation of a semiconductor structure at various intermediate stages, in accordance with some embodiments of the disclosure.

FIG. 2 is a schematic diagram illustrating deposition cycles of an atomic layer deposition (ALD) for forming a lining layer, in accordance with some embodiments of the disclosure.

FIGS. 3A-3E are schematic views exhibiting various profiles of the carbon concentration of a lining layer before an anneal process, in accordance with some embodiments of the disclosure.

FIGS. 4A-4E are schematic views exhibiting various profiles of the carbon concentration of a lining layer after an anneal process, in accordance with some embodiments of the disclosure.

FIGS. 5A-1, 5A-2 and 5A-3, 5B-1, 5B-2 and 5B-3, 5C-1, 5C-2 and 5C-3, and 5D-1, 5D-2 and 5D-3 are cross-sectional views illustrating the formation of a semiconductor structure at various intermediate stages, in accordance with some embodiments of the disclosure.

FIGS. 6A and 6B-1, 6B-2 and 6B-3 are cross-sectional views illustrating the formation of a semiconductor structure at various intermediate stages, in accordance with some embodiments of the disclosure.

FIGS. 7A-1, 7A-2 and 7A-3 and 7B-1, 7B-2 and 7B-3 are cross-sectional views illustrating the formation of a semiconductor structure at various intermediate stages, in accordance with some embodiments of the disclosure.

DETAILED DESCRIPTION

Figure 1A:
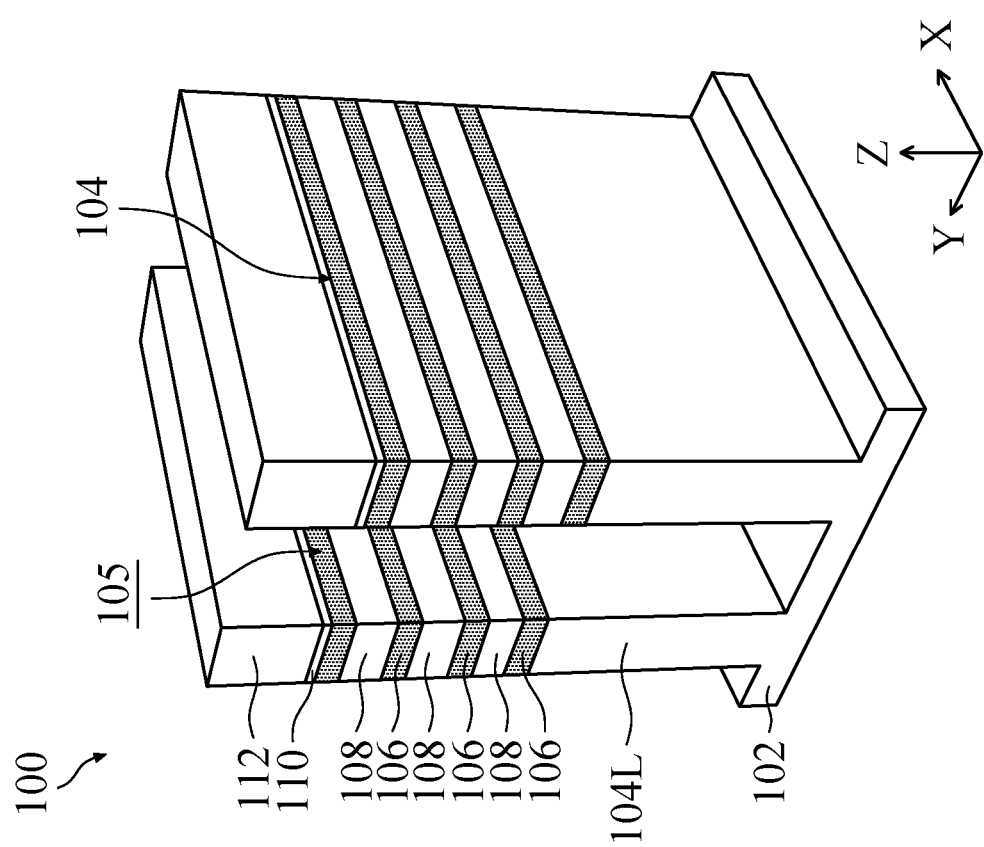

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. For example, some embodiments provide a semiconductor structure having a dielectric fin structure. The dielectric fin structure includes the lining layer and a fill layer nested within the lining layer. The carbon concentration of the lining layer varies, e.g., the carbon concentration may decrease from a first side facing the source/drain feature toward a second side facing the fill layer. As a result, the lining layer may exhibit a good etching resistance on the first side and a good oxidation resistance on the second side. Therefore, the process windows for manufacturing a semiconductor device may be enlarged, and the manufacturing yield of the resulting semiconductor device may be increased.

FIG. 1A is a perspective view of a semiconductor structure 100, in accordance with some embodiments. The semiconductor structure 100 includes a substrate 102 and semiconductor fin structures 104 over the substrate 102, as shown in FIG. 1A, in accordance with some embodiments. Although two semiconductor fin structures 104 are shown in FIG. 1A, the numbers are not limited to two.

The substrate 102 may be a portion of a semiconductor wafer, a semiconductor chip (or die), or the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

For a better understanding of the semiconductor structure 100, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The semiconductor fin structures 104 have longitudinal axes parallel to X direction, in accordance with some embodiments. The semiconductor fin structures 104 include channel regions and source/drain regions, where the channel regions are defined between the source/drain regions, in accordance with some embodiments. A source/drain refers to a source and/or a drain. It is noted that in the present disclosure, a source and a drain are used interchangeably and the structures thereof are substantially the same. The X direction may also be referred to as the channel-extending direction such that the current of the resulting semiconductor device (e.g., nanostructure transistor) flows in the X direction through the channel. Gate structures or gate stacks will be formed with longitudinal axes parallel to the Y direction and extend across and/or surround the channel regions of the semiconductor fin structures 104. The Y direction may also be referred to as a gate-extending direction.

Each of the semiconductor fin structures 104 includes a lower fin elements 104L formed from a portion of the substrate 102 and an upper fin element formed from an epitaxial stack including alternating first semiconductor layers 106 and second semiconductor layer 108, as shown in FIG. 1A, in accordance with some embodiments.

The formation of the semiconductor fin structures 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range of about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate structure and gate stack will be formed across and wrap around the nanostructures, in accordance with some embodiments.

In some embodiments, the thickness of each of the first semiconductor layers 106 is in a range of about 3 nm to about 20 nm, such as about 4 nm to about 12 nm. In some embodiments, the thickness of each of the second semiconductor layers 108 is in a range of about 3 nm to about 20 nm, such as about 4 nm to about 12 nm. The thickness of the second semiconductor layers 108 may be greater than, equal to, or less than the first semiconductor layers 106, which may depend on the amount of gate materials to be filled in spaces where the first semiconductor layers 106 are removed. In some embodiments, the number of the first semiconductor layers 106 is one more than the number of the second semiconductor layers 108. That is, both the lowermost layer and uppermost layer of the epitaxial stack are the first semiconductor layers 106. Although four first semiconductor layers 106 and three second semiconductor layers 108 are shown in FIG. 1A, the numbers are not limited thereto. By adjusting the number of the semiconductor layers, a driving current of the resulting nanostructure device can be adjusted.

The epitaxial stack (including the first semiconductor layers 106 and the second semiconductor layers 108) and the underlying substrate 102 are then patterned into the semiconductor fin structures 104, in accordance with some embodiments. In some embodiments, the patterning process includes forming patterned hard mask layers 110 and 112 over the epitaxial stack. In some embodiments, the patterned hard mask layer 110 is made of oxide (such as silicon oxide) and the patterned hard mask layer 112 is made of nitride (such as silicon nitride). The patterning process further includes performing an etching process to remove portions of the epitaxial stack and the substrate 102 uncovered by the patterned hard mask layers 110 and 112, thereby forming trenches 105 and the semiconductor fin structures 104 protruding from between the trenches 105, in accordance with some embodiments. The etching process may be an anisotropic etching process, e.g., dry plasma etching.

The portion of the substrate 102 protruding from between the trenches 105 forms lower fin elements 104L of the semiconductor fin structures 104, in accordance with some embodiments. The remainder of the epitaxial stack (including the first semiconductor layers 106 and the second semiconductor layers 108) forms the upper fin elements of the semiconductor fin structures 104 over the lower fin elements 104L, in accordance with some embodiments. In some embodiments, the semiconductor fin structures 104 are configured as active regions (also referred to as oxide definition (OD)) of the semiconductor structure 100.

Figure 1B:
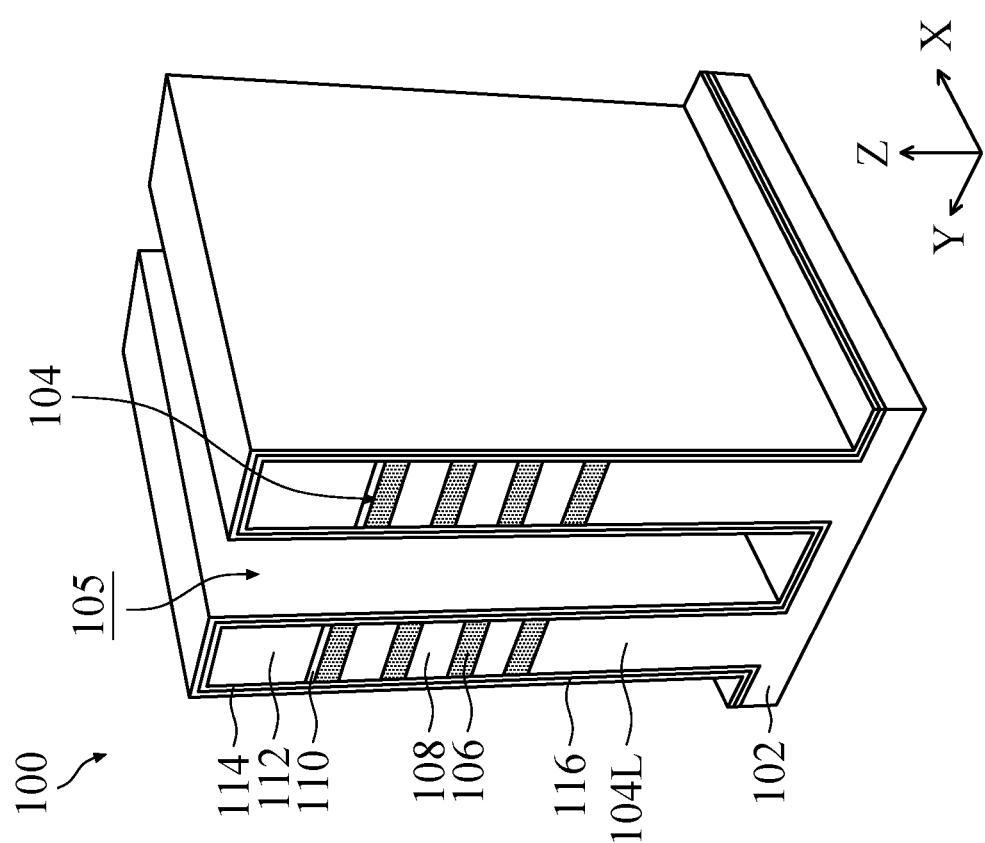

FIG. 1B is a perspective view of the semiconductor structure 100 after the formation of a dielectric liner 114 and a semiconductor liner 116, in accordance with some embodiments. A dielectric liner 114 and a semiconductor liner 116 are sequentially formed over the semiconductor structure 100 to partially fill the trenches 105, as shown in FIG. 1B, in accordance with some embodiments. In some embodiments, the dielectric liner 114 is made of dielectric material such as silicon oxide (SiO), silicon nitride (SiN), silicon oxynitride (SiON), another suitable insulating material, multilayers thereof, and/or a combination thereof. In some embodiments, the semiconductor liner 116 is made of semiconductor material such as silicon (such as polysilicon) and/or silicon germanium (such as poly-silicon germanium). In an embodiment, the dielectric liner 114 is made of silicon oxide (SiO) and the semiconductor liner 116 is made of polysilicon. In some embodiments, the dielectric liner 114 and the semiconductor liner 116 are conformally deposited using includes CVD (such as plasma-enhanced CVD (PECVD), low-pressure CVD (LPCVD), high density plasma CVD (HDP-CVD), or high aspect ratio process (HARP)), atomic layer deposition (ALD), another suitable technique, and/or a combination thereof.

Figure 1C:
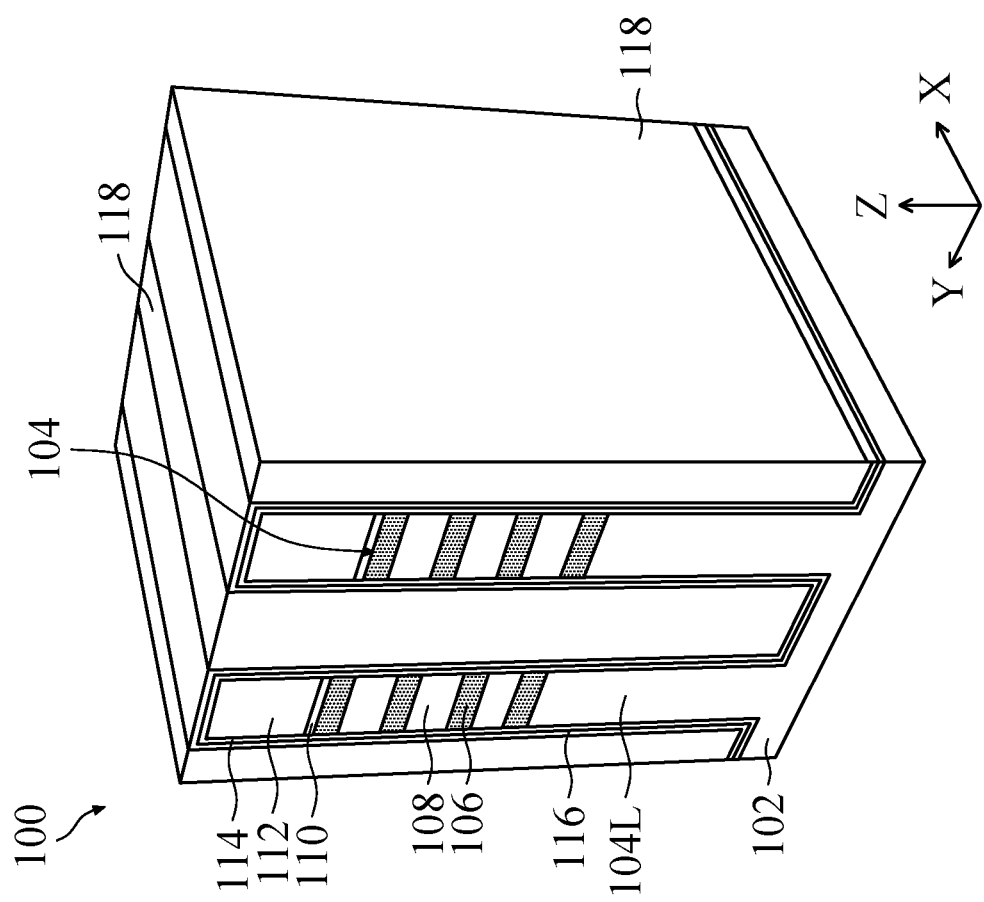

FIG. 1C is a perspective view of the semiconductor structure 100 after the formation of an insulating material 118, in accordance with some embodiments. An insulating material 118 is formed over the semiconductor liner 116 to overfill the trenches 105, as shown in FIG. 1C, in accordance with some embodiments. In some embodiments, the insulating material 118 includes silicon oxide ($SiO_2$), silicon nitride (SiN), silicon oxynitride (SiON), another suitable insulating material, multilayers thereof, and/or a combination thereof. In some embodiments, the insulating material 118 is formed using CVD such as LPCVD, PECVD, HDP-CVD, HARP, FCVD (flowable CVD), ALD, another suitable technique, and/or a combination thereof. In some embodiments, the insulating material 118 may be bi-layered or multi-layered, for example, a lining layer and a bulk layer over the lining layer.

A planarization process is then performed to remove a portion of the insulating material 118 above the top surfaces of the semiconductor liner 116 until the semiconductor liner 116 is exposed, as shown in FIG. 1C, in accordance with some embodiments. In some embodiments, the planarization process is an etching-back process such as dry plasma etching and/or wet chemical etching, and/or a chemical mechanical polishing (CMP) process.

Figure 1D:
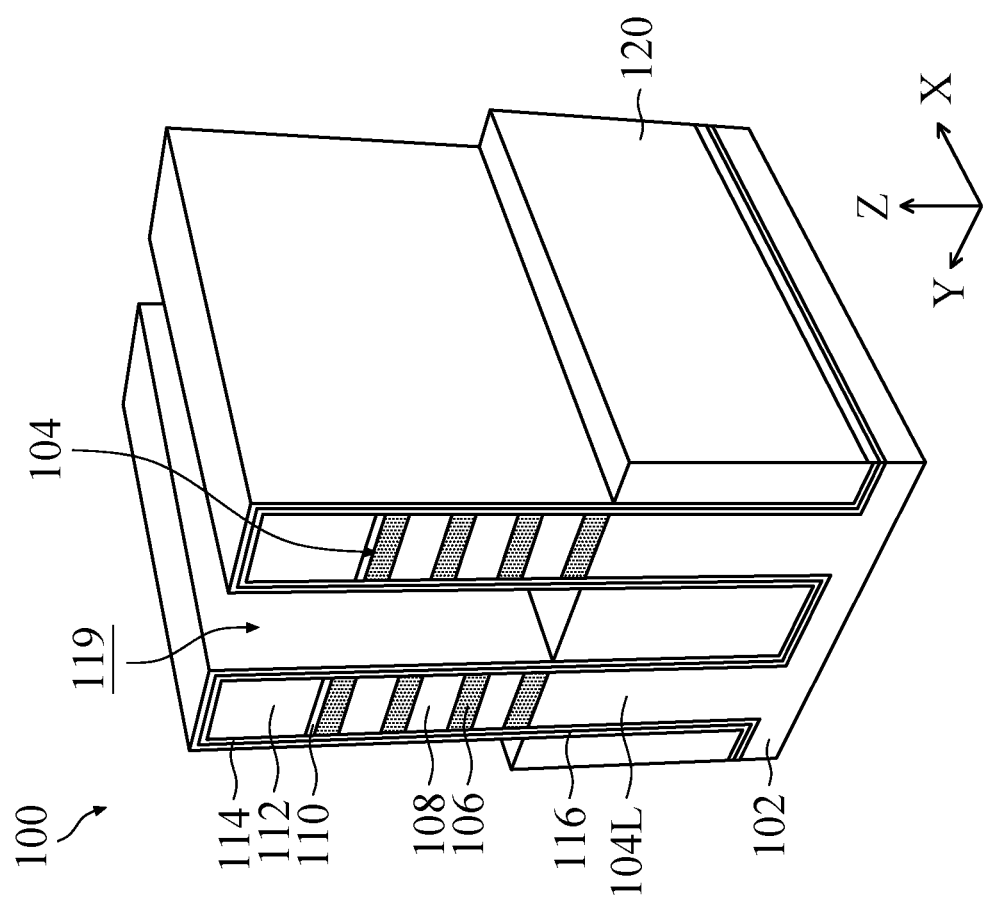

FIG. 1D is a perspective view of the semiconductor structure 100 after an etching process, in accordance with some embodiments. The insulating material 118 is recessed using an etching process (such as anisotropic etching process such as dry plasma etching, an isotropic etching process such as dry chemical etching, remote plasma etching or wet chemical etching, and/or a combination thereof) to form trenches 119 between the semiconductor fin structures 104, in accordance with some embodiments. The trenches 119 expose upper portions of the semiconductor liner 116, in accordance with some embodiments. The trenches 119 have bottom surfaces substantially level with the tops of the lower fin elements 104L, in accordance with some embodiments.

The remainder of the insulating material 118 is referred to as an isolation structure 120, as shown in FIG. 1D, in accordance with some embodiments. The isolation structure 120 surrounds the lower fin elements 104L, in accordance with some embodiments. The isolation structure 120 is configured to electrically isolate active regions (e.g., the semiconductor fin structures 104) of the semiconductor structure 100 and is also referred to as shallow trench isolation (STI) feature, in accordance with some embodiments.

Figure 1E:
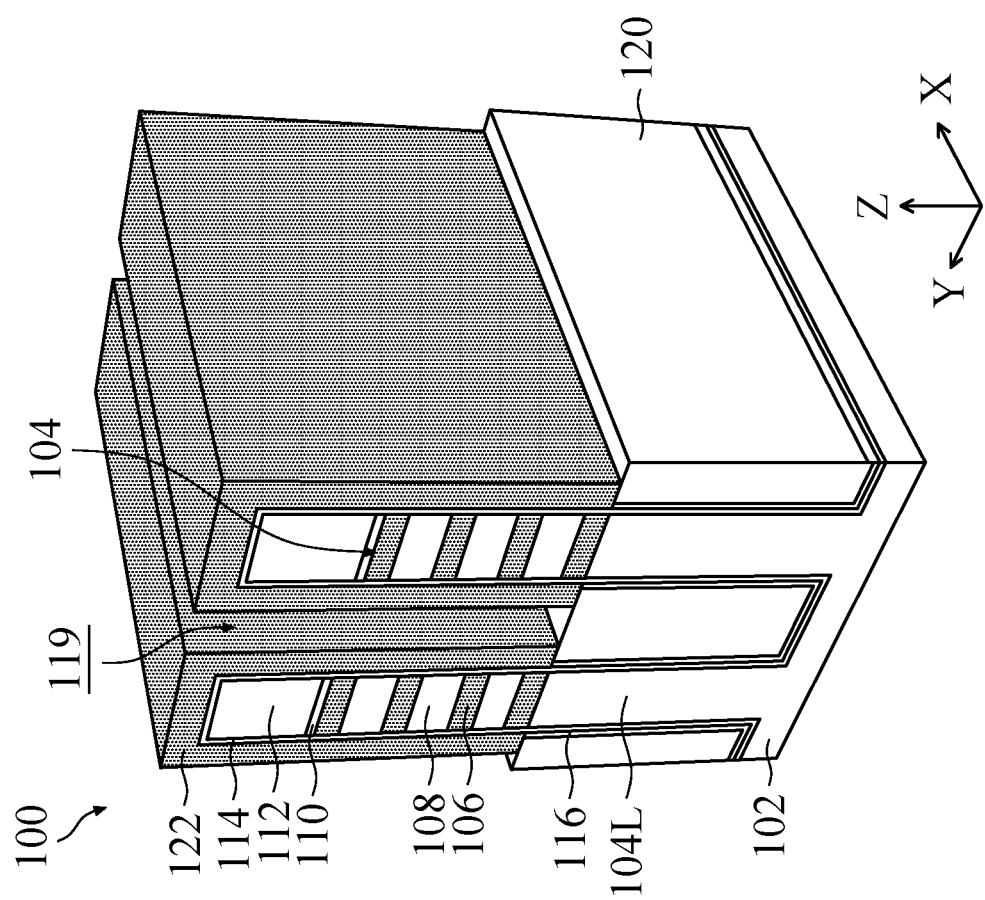

FIG. 1E is a perspective view of the semiconductor structure 100 after the formation of semiconductor capping layers 122, in accordance with some embodiments. Semiconductor capping layers 122 are formed along the exposed upper portions of the semiconductor liner 116 using an epitaxial growth process to partially fill the trenches 119, as shown in FIG. 1E, in accordance with some embodiments. The epitaxial growth process may be MBE, MOCVD, or VPE, another suitable technique, or a combination thereof. In some embodiments, the semiconductor capping layers 122 are made of semiconductor material such as silicon and/or silicon germanium. In an embodiment, the semiconductor liner 116 is made of silicon and the semiconductor capping layers 122 are made of silicon germanium.

In some embodiments, the exposed upper portions of the semiconductor liner 116 provide semiconductor surfaces on which the semiconductor capping layers 122 grow. During the epitaxial growth process, the exposed upper portions of the semiconductor liner 116 are incorporated into the semiconductor capping layers 122, and thus formed into a portion of the semiconductor capping layers 122, in accordance with some embodiments. In some embodiments, the semiconductor capping layer 122 may substantially be not formed on the dielectric surface of the isolation structure 120 due to the characteristics of the epitaxial growth process.

Figures 1, 1F:
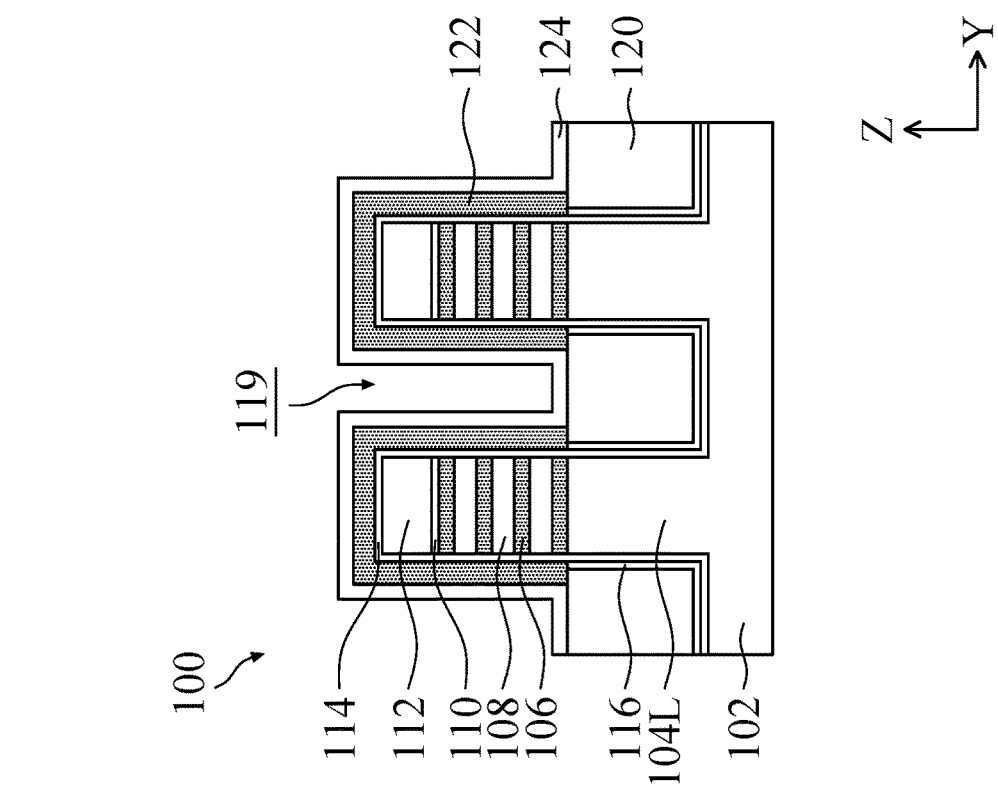
Figure 1F:
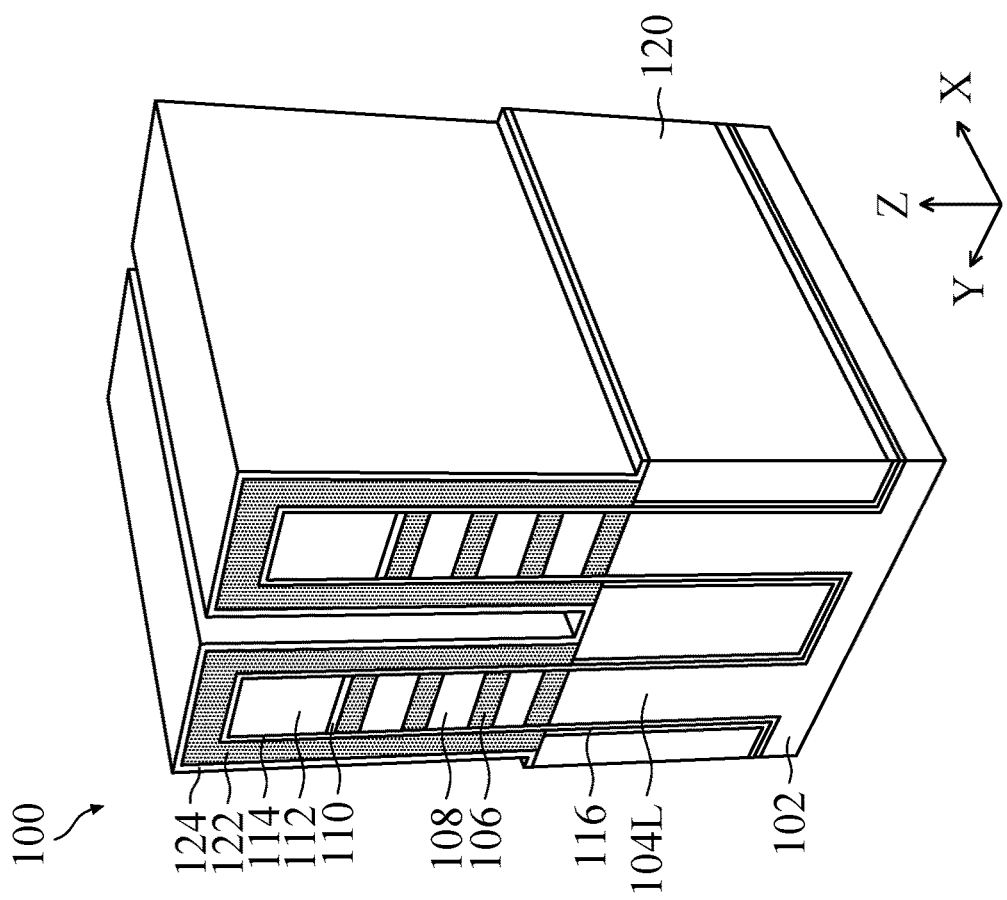

FIG. 1F is a perspective view of the semiconductor structure 100 after the formation of a lining layer 124, in accordance with some embodiments. FIG. 1F-1 is a cross-sectional view of the semiconductor structure 100 cut through a plane Y-Z, in accordance with some embodiments. A lining layer 124 is conformally formed over the semiconductor structure 100 to cover the upper surfaces and the sidewalls of the semiconductor capping layers 122 and the upper surface of the isolation structure 120, as shown in FIGS. 1F and 1F-1, in accordance with some embodiments. The lining layer 124 partially fills the trenches 119, in accordance with some embodiments.

In some embodiments, the lining layer 124 comprises a carbon-containing dielectric material, such as silicon carbon nitride (SiCN), silicon oxycarbonitride (SiOCN), and/or oxygen-doped silicon carbonitride (Si(O)CN). In some embodiments, the dielectric constant (k) of the lining layer 124 may be lower than 7. In some embodiments, the dielectric constant (k) of the lining layer 124 may be lower than the k-value of silicon oxide (SiO), such as lower than 4.2, equal to or lower than about 3.9, such as in a range of about 3.5 to about 3.9. In some embodiments, the carbon concentration of the lining layer 124 varies, e.g., decreases from the inner surface interfaced with the semiconductor capping layer 122 and the isolation structure 120 toward the exposed outer surface.

In some embodiments, the lining layer 124 is conformally deposited using an ALD process in an ALD chamber. In some embodiments, the ALD process for forming the lining layer 124 includes multiple deposition cycles. Each of the deposition cycles includes one or more operations e.g., a deposition operation, a purge operation and/or another applicable operation (such as pumping-down operation, plasma operation, etc.).

In some embodiments, the deposition operation of each of the deposition cycles includes introducing (or flowing or pulsing) reactive gasses such as a carbon-containing precursor, a silicon-containing precursor and a nitrogen-containing precursor into the ALD chamber. In some embodiments, in a cycle, the carbon-containing precursor, the silicon-containing precursor and the nitrogen-containing precursor are together introduced in one deposition operation. In alternative embodiments, in a cycle, introducing the carbon-containing precursor, introducing the silicon-containing precursor and introducing the nitrogen-containing precursor are sequentially performed in separate deposition operations and the sequence these deposition operations may be altered.

In addition, in a cycle, purge operations may be performed at the beginning of the cycle, or at the end of the cycle, and/or between the deposition operations. A gas for purge operations can be an inert gas, such as argon (Ar) or helium (He).

In some embodiments, the carbon-containing precursor is or includes $CH_4$, $C_2H_4$, and/or $C_3H_6$ and provides carbon composition for the lining layer 124. In some embodiments, the silicon-containing precursor is or includes $SiH_4$, $Si_2H_6$, and/or dichlorosilane (DCS) and provides silicon composition for the lining layer 124. In some embodiments, the nitrogen-containing precursor is or includes $NH_3$ and/or $N_2$ and provides nitrogen composition for the lining layer 124. In some embodiments, a carrier gas (such as an inert gas such as argon (Ar) or helium (He)) may flow along with the reactive precursors. The ALD chamber may be equipped with several pipelines, each of which may be equipped with control valves, thereby controlling the time periods of the introduction of the respective gases (such as reactive precursors, carrier gas, purge gas, etc.).

The precursors react with each other to form a monolayer of the material for lining layer 124. The deposition cycles may repeat several times, thereby stacking the monolayers layer by layer until the lining layer 124 has a desired thickness. In some embodiments, the lining layer 124 has a thickness in a range from about 3 nm to about 7 nm.

Figures 1, 1G:
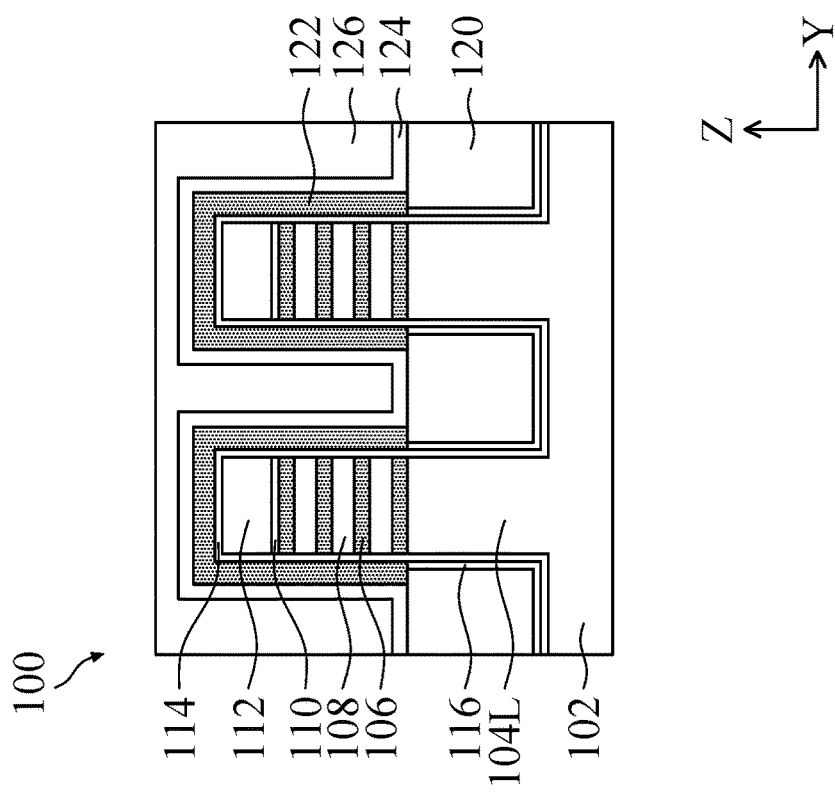
Figure 1G:
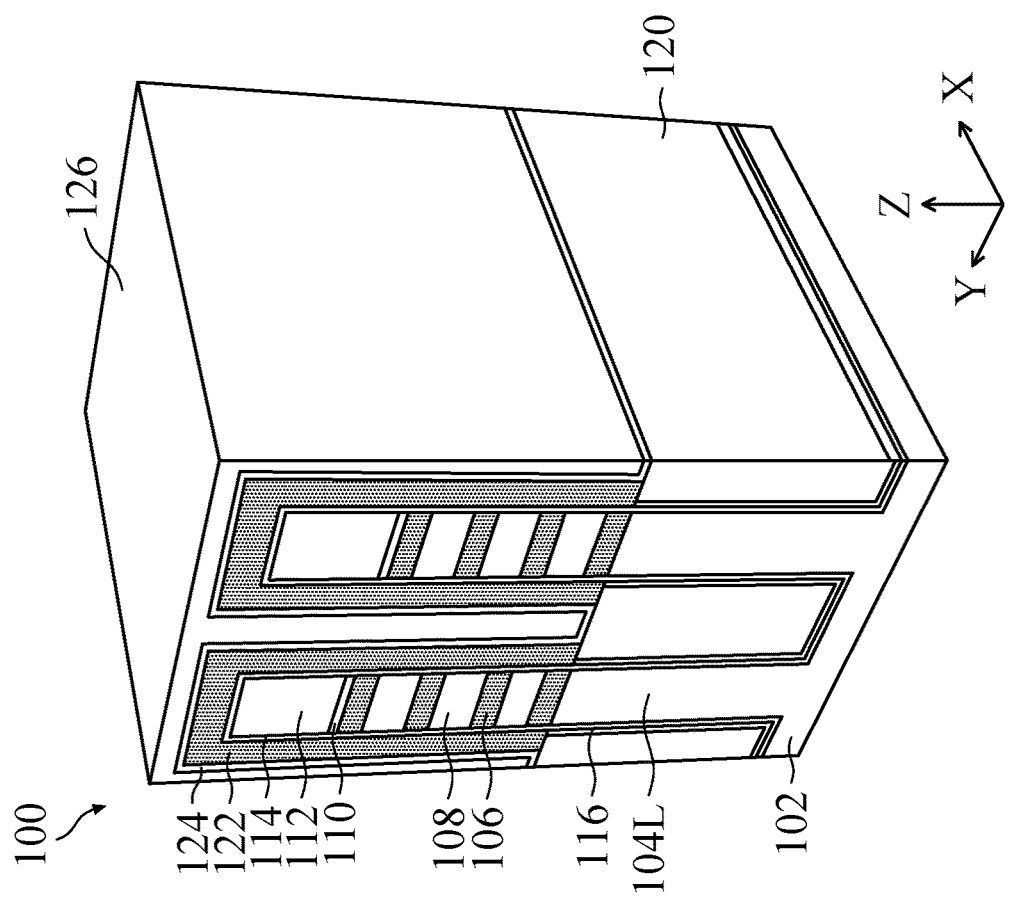
Figures 1, 1H:
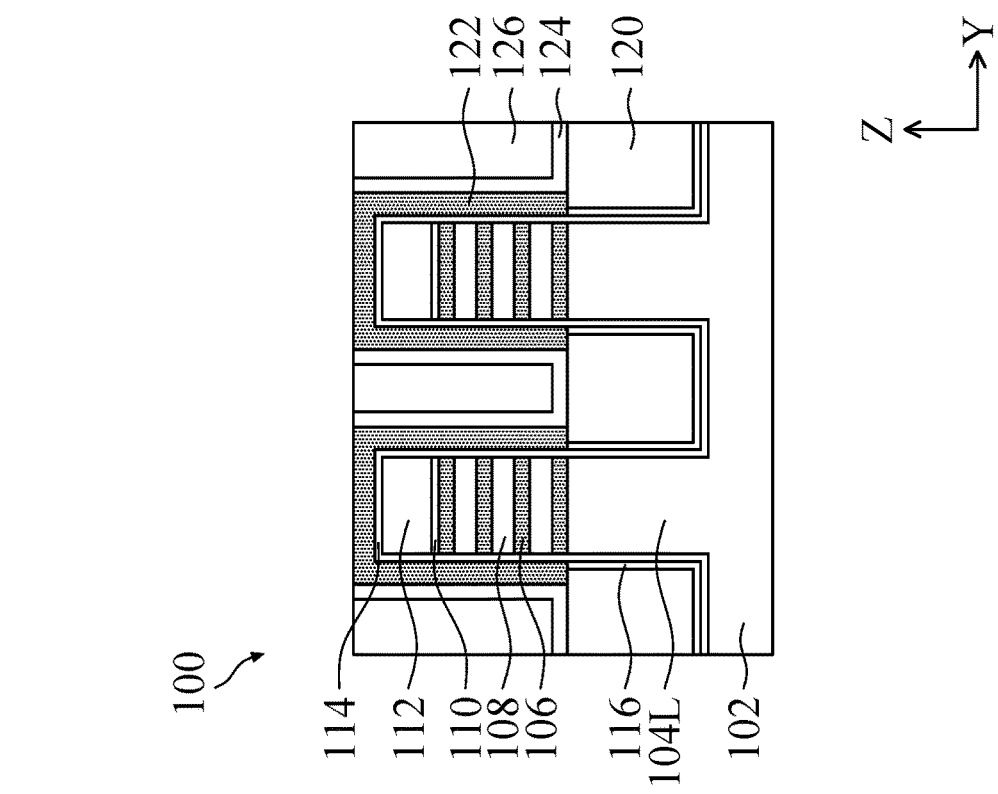
Figure 1H:
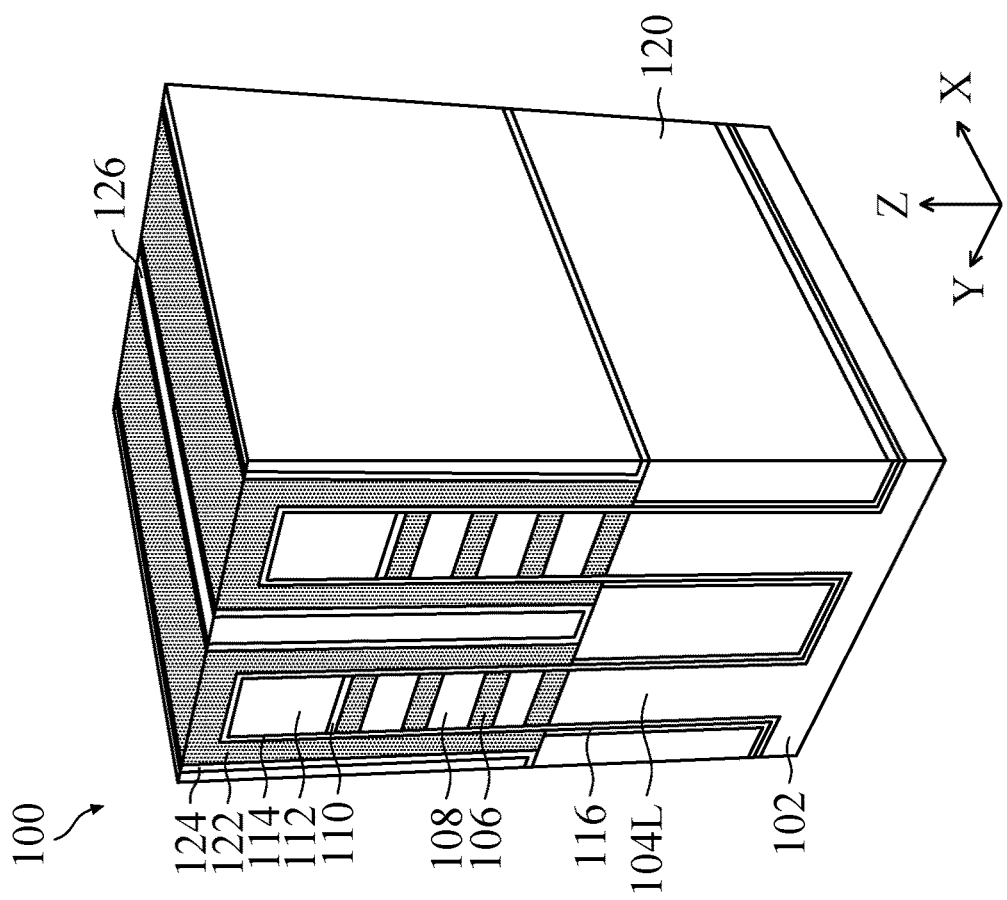
Figures 1, 1I:
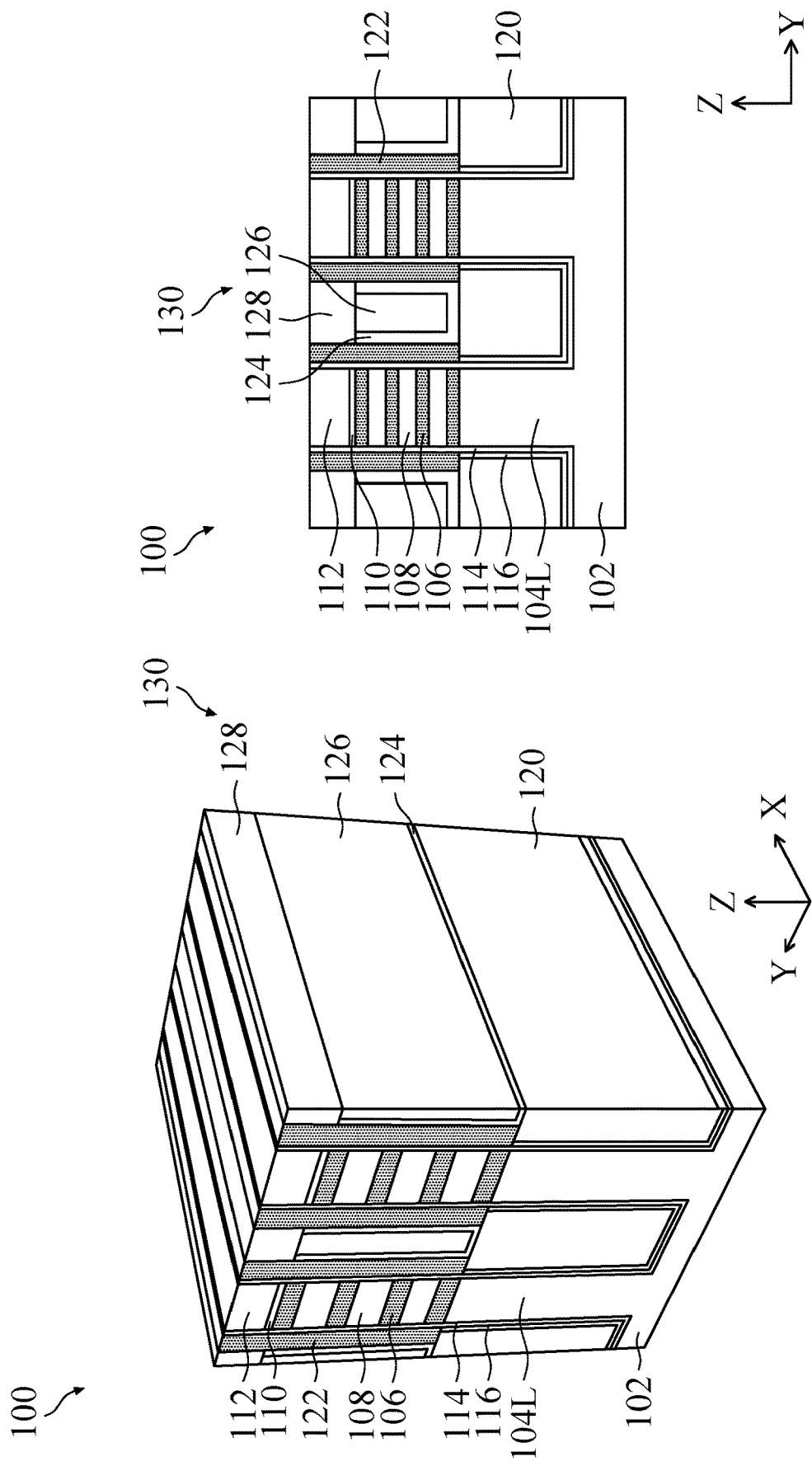
Figure 1K:
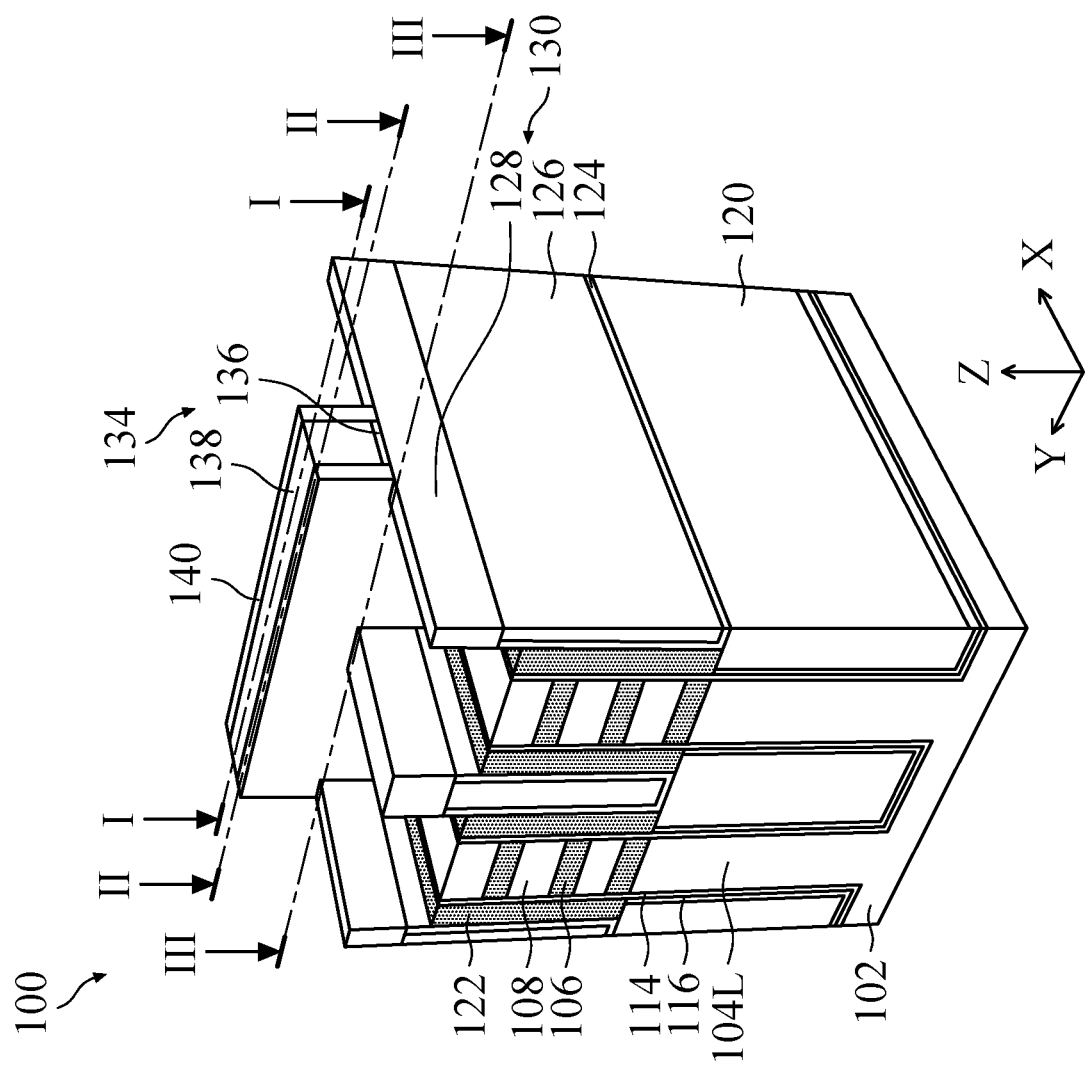
Figures 1, 1K, 2, 3:
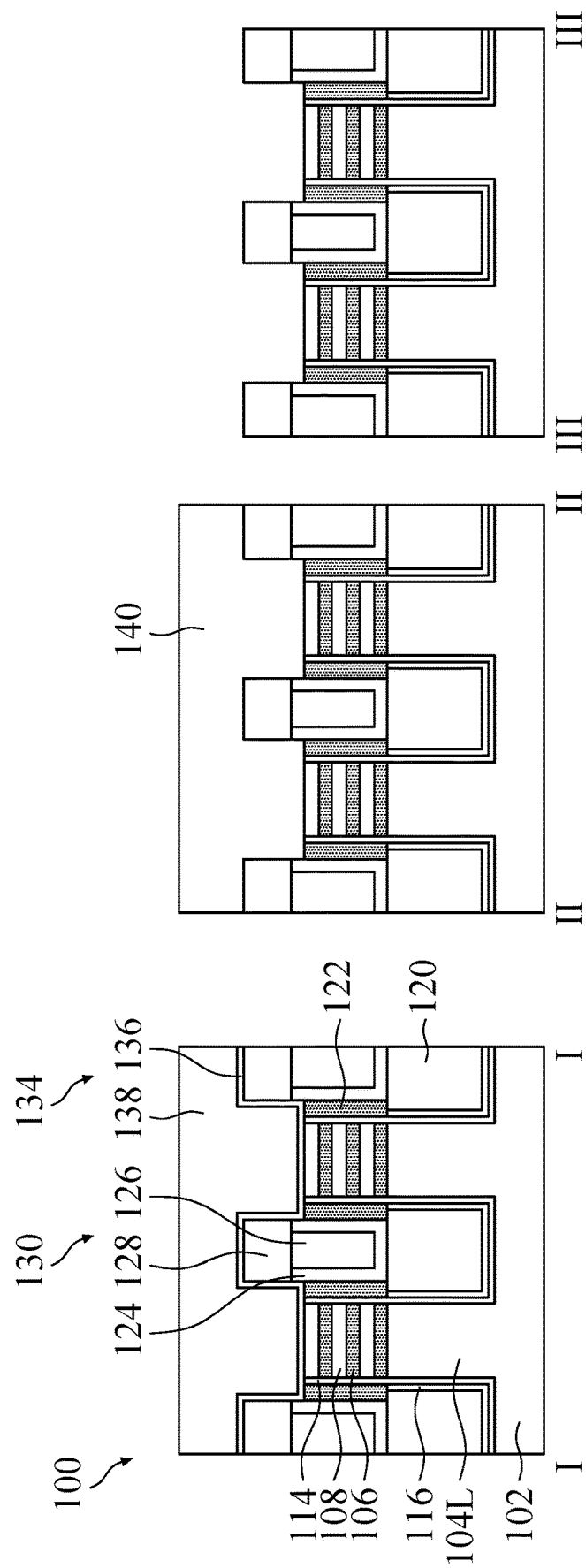

FIG. 2 is a schematic diagram of an embodiment illustrating deposition cycles of the ALD for forming the lining layer 124, in accordance with some embodiments. In a cycle, the carbon-containing precursor is introduced for a first time period $t1_j$, the silicon-containing precursor is introduced for a second time period $t2_j$, and the nitrogen-containing precursor is introduced for a third time period $t3_j$, as shown in FIG. 2, in accordance with some embodiments. Subscript "j" represents the order of the cycle and is an integer of 1 (the first cycle) to "n" (the last cycle). In some embodiments, the deposition cycles of the ALD process may be repeated 60-100 times (e.g., "n" is 60-100).

In some embodiments, the first time period $t1_j$ of introducing the carbon-containing precursor varies as the deposition cycles proceed. For example, as the deposition cycles proceed, the first time periods $t1_j$ of introducing the carbon-containing precursor decrease from the first cycle (j=1) toward the last cycle (j=n), while the second time periods $t2_j$ of introducing the silicon-containing precursor and the third time periods $t3_j$ of introducing the nitrogen-containing precursor remain constant from the first cycle (j=1) to the last cycle (j=n), as shown in FIG. 2, in accordance with some embodiments.

For example, the first time period $t1_1$ (at the first cycle) may be from about 50 seconds to about 300 seconds, and the first time period t1 gradually decreases as the deposition cycles proceed, and the first time period $t1_n$ (at the last cycle) may be less than 60 seconds. In some embodiments, in the last cycle, or the last few cycles, the carbon-containing precursor may not be introduced into the ALD chamber (e.g., $t1_n$ is zero). In some embodiments, the second time period $t2_j$ of introducing the silicon-containing precursor is in a range from about 10 seconds to about 60 seconds. In some embodiments, the third time period $t3_j$ of introducing the nitrogen-containing precursor is in a range from about 5 seconds to about 100 seconds.

In some embodiments, the ratio $(t1_j/t2_j)$ of the first time period $t1_j$ to the second time period $t2_j$ decreases as the deposition cycles proceed. In some embodiments, the ratio $(t1_j/t2_j)$ of the first time period $t1_j$ to the second time period $t2_j$ starts from about 5-7 at the first cycle and decreases to less than about 2 at the last cycle. In some embodiments, the ratio $(t1_j/t3_j)$ of the first time period $t1_j$ to the third time period $t3_j$ decreases as the deposition cycles proceed. In some embodiments, the ratio $(t1_j/t3_j)$ of the first time period $t1_j$ to the third time period $t3_j$ starts from about 5-7 at the first cycle and decreases to less than about 2 at the last cycle.

In some embodiments, the carbon-containing precursor, the silicon-containing precursor and the nitrogen-containing precursor are introduced in the same operation. For example, the control valves of the pipelines for introducing the carbon-containing precursor, the silicon-containing precursor and the nitrogen-containing precursor are turned on simultaneously, and turned off according to respective time periods t1, t2 and t3.

In some embodiments, the flow rate of the carbon-containing precursor is in a range from about 10 standard cubic centimeter per minute (sccm) to about 10000 sccm; the flow rate of the silicon-containing precursor is in a range from about 10 sccm to about 10000 sccm; and the flow rate of the nitrogen-containing precursor is in a range from about 10 sccm to about 10000 sccm. In some embodiments, the deposition cycles are performed at a pressure of about 1 Torr to about 15 Torr. In some embodiments, the ALD process may be performed for 100 minutes to about 240 minutes.

As a result, the carbon concentration in the lining layer 124 decreases from the first monolayer (formed on the surface provided by the semiconductor capping layer 122 and the isolation structure 120) to the last monolayer (exposed to the ambient atmosphere), in accordance with some embodiments. That is, the carbon concentration of the lining layer 124 decreases from the inner surface facing the semiconductor capping layer 122 and the isolation structure 120 toward the exposed outer surface. It should be noted that the decrease in the carbon concentration may be continuous based on such mathematical functions as linear, sinuous, parabolic, or elliptical functions, or may be stepwise.

The lining layer 124 has a higher carbon concentration at the interface between the semiconductor capping layer 122 and the lining layer 124, and thus the lining layer 124 has a good etching resistance for subsequent etching processes, in accordance with some embodiments. The lining layer 124 has a lower carbon concentration at its exposed outer surface, and thus the lining layer 124 has a good oxidation resistance to prevent the semiconductor capping layer 122 and the semiconductor layers 106 and 108 from being oxidized, in accordance with some embodiments. These will be discussed in detail later.

FIG. 1G is a perspective view of the semiconductor structure 100 after the formation of a fill layer 126, in accordance with some embodiments. FIG. 1G-1 is a cross-sectional view of the semiconductor structure 100 cut through a plane Y-Z, in accordance with some embodiments. A fill layer 126 is formed over the lining layer 124 to overfill the remainder of the trenches 119, as shown in FIGS. 1G and 1G-1, in accordance with some embodiments.

In some embodiments, fill layer 126 is made of dielectric material such as silicon oxide ($SiO_2$), silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), or a combination thereof. In some embodiments, the fill layer 126 is deposited using CVD (such as FCVD, LPCVD, PECVD, HDP-CVD or HARP), ALD, another suitable technique, and/or a combination thereof. In some embodiments, the fill layer 126 is made of dielectric material having a dielectric constant less than about 7. In some embodiments, the dielectric constant (k) of the fill layer 126 may be equal to or lower than the k-value of silicon oxide (SiO), such as equal to or lower than 4.2, equal to or lower than about 3.9, such as in a range of about 3.5 to about 3.9.

In some embodiments, the fill layer 126 and the lining layer 124 are made of different materials. In some embodiments, the fill layer 126 is made of an oxide (such as silicon oxide formed by FCVD), and the lining layer 124 is made of a carbon-containing dielectric (such as silicon carbon nitride (SiCN)). In some embodiments, the dielectric constant (k) of the fill layer 126 is lower than the dielectric constant (k) of the lining layer 124.

After the fill layer 126 is deposited, an anneal process is performed on the semiconductor structure 100 to densify the fill layer 126, in accordance with some embodiments. In some embodiments, in the anneal process, the semiconductor structure 100 is positioned in a high-temperature chamber or tube under an oxidizing atmosphere such as using a mixture of $H_2O$ and $N_2$, a mixture of $O_2$ and $N_2$, or a mixture of $H_2O$, $O_2$ and $N_2$. In some embodiments, the anneal process may be performed at 200° C. to about 600° C. for a duration in a range from about 30 seconds to about 300 minutes.

In some embodiments, during the anneal process, the oxidizing gas from the high-temperature chamber diffuses into the lining layer 124, and may further oxidize the semiconductor capping layer 122 and the semiconductor layers 106 and 108. If the semiconductor capping layer 122 and the semiconductor layers 106 and 108 are oxidized, which may increase the difficulty of subsequent processes and/or reduce the dimension of the resulting nanostructures, thereby degrading the performance of the resulting semiconductor device.

In some embodiments, the lining layer 124 with a low carbon concentration may have a better ability to hinder the diffusion of the oxidizing gas. The lining layer 124 has a lower carbon concentration at the interface between the fill layer 126 and the lining layer 124, thereby enhancing the oxidation resistance on this side, which may reduce the risk of the oxidation of the semiconductor capping layer 122 and the semiconductor layers 106, in accordance with some embodiments.

FIG. 1H is a perspective view of the semiconductor structure 100 after a planarization process, in accordance with some embodiments. FIG. 1H-1 is a cross-sectional view of the semiconductor structure 100 cut through a plane Y-Z, in accordance with some embodiments. A planarization process is performed on the fill layer 126 and the lining layer 124 until the semiconductor capping layers 122 are exposed, as shown in FIGS. 1H and 1H-1, in accordance with some embodiments. In some embodiments, the planarization process is an etching-back process such as dry plasma etching and/or wet chemical etching and/or a CMP process.

FIG. 1I is a perspective view of the semiconductor structure 100 after the formation of protection layers 128, in accordance with some embodiments. FIG. 1I-1 is a cross-sectional view of the semiconductor structure 100 cut through a plane Y-Z, in accordance with some embodiments. The lining layer 124 and the fill layer 126 are etched to form recesses between the semiconductor capping layers 122, and then protection layers 128 are formed in the recesses over the etched lining layer 124 and the etched fill layer 126, as shown in FIGS. 1I and 1I-1, in accordance with some embodiments. The etching process may be an anisotropic etching process such as dry plasma etching, an isotropic etching process such as dry chemical etching, remote plasma etching or wet chemical etching, and/or a combination thereof. In some embodiments, the upper surfaces of the etched lining layer 124 and the etched fill layer 126 are located at a level substantially equal to the upper surface of the uppermost first semiconductor layer 106.

The protection layers 128 are made of a dielectric material with a dielectric constant greater than about 7. In some embodiments, the dielectric material for the protection layers 128 is $Al_2O_3$, $HfO_2$, $ZrO_2$, HfAlO, HfSiO, or a combination thereof. In some embodiments, the protection layers 128 are made of different materials than the lining layer 124 and the fill layer 126. In some embodiments, a dielectric material for the protection layers 128 are deposited to overfill the recesses using ALD, CVD (such as LPCVD, PECVD, HDP-CVD, HARP, or FCVD), another suitable technique, and/or a combination thereof.

A planarization process is performed on the semiconductor structure 100 to remove portions of the semiconductor capping layers 122 and the dielectric liner 114 above the patterned hard mask layers 112 until the upper surfaces of the patterned hard mask layers 112 are exposed, as shown in FIGS. 1I and 1I-1, in accordance with some embodiments. Portions of the protection layers 128 over the patterned hard mask layers 112 also removed. In some embodiments, the planarization process is CMP, etching back process, or a combination thereof.

The protection layers 128, the fill layer 126 and the lining layer 124 in the trenches 119 combine to form dielectric fin structures 130, in accordance with some embodiments. In some embodiments, the dielectric fin structures 130 are located between and spaced apart from the semiconductor fin structures 104. In some embodiments, the dielectric fin structures 130 extend in the X direction. The dielectric fin structures 130 have longitudinal axes parallel to X direction and substantially parallel to the semiconductor fin structures 104, in accordance with some embodiments. In some embodiments, the dielectric fin structure 130 includes the lining layer 124, the fill layer 126 nested within the lining layer 124, and the protection layer 128 covering the upper surfaces of the lining layer 124 and the fill layer 126. In some embodiments, the dielectric fin structure 130 may also be referred to as a hybrid fin structure and configured as a portion for cutting a gate stack.

FIG. 1J is a perspective view of the semiconductor structure 100 after one or more etching processes, in accordance with some embodiments. FIG. 1J-1 is a cross-sectional view of the semiconductor structure 100 cut through a plane Y-Z, in accordance with some embodiments. One or more etching processes are performed on the semiconductor structure 100 to recess the semiconductor capping layer 122 and remove the patterned hard mask layers 112 and 110 and uppermost first semiconductor layer 106, thereby exposing the uppermost second semiconductor layer 108, as shown in FIGS. 1J and 1J-1, in accordance with some embodiments. Recesses 132 are formed over the semiconductor fin structures 104 between the dielectric fin structures 130, in accordance with some embodiments. In some embodiments, the sidewalls of the lining layer 124 are partially exposed from the recesses 132, in accordance with some embodiments.

The one or more etching processes may be anisotropic etching process such as dry plasma etching, an isotropic etching process such as dry chemical etching, remote plasma etching or wet chemical etching, and/or a combination thereof. In some embodiments, the one or more etching processes use the protection layers 128 of the dielectric fin structures 130 as etch masks without the need for an additional photolithography process.

FIG. 1K is a perspective view of the semiconductor structure 100 after the formation of a dummy gate structure 134 and gate spacer layers 140, in accordance with some embodiments. FIG. 1K-1 is a cross-sectional view of the semiconductor structure 100 cut through Cross-section I-I shown in FIG. 1K, in accordance with some embodiments. FIG. 1K-2 is a cross-sectional view of the semiconductor structure 100 cut through Cross-section II-II shown in FIG. 1K, in accordance with some embodiments. FIG. 1K-3 is a cross-sectional view of the semiconductor structure 100 cut through Cross-section III-III shown in FIG. 1K, in accordance with some embodiments. Cross-section I-I is in a plan parallel to the Y direction and across a gate structure 134 (or a gate stack), in accordance with some embodiments. Cross-section II-II is in a plan parallel to the Y direction and across a gate spacer layer 140, in accordance with some embodiments. Cross-section III-III is in a plan parallel to the Y direction and across the source/drain region of the semiconductor fin structure 104, in accordance with some embodiments. These reference cross-sections are used in later figures.

Dummy gate structure 134 is formed over the semiconductor structure 100, as shown in FIGS. 1K and 1K-1, in accordance with some embodiments. The dummy gate structure 134 extends over and covers the channel regions of the semiconductor fin structures 104, the semiconductor capping layers 122, and the dielectric fin structures 130 and surrounds upper portions of the dielectric fin structures 130, in accordance with some embodiments. The dummy gate structure 134 is configured as a sacrificial structure and will be replaced with an active gate stack, in accordance with some embodiments.

In some embodiments, the dummy gate structure 134 extends in the Y direction. That is, the dummy gate structure 134 has a longitudinal axis parallel to Y direction, in accordance with some embodiments. FIG. 1K shows one dummy gate structure 134 for illustrative purpose and is not intended to be limiting. The number of the dummy gate structure 134 may be dependent on the semiconductor device design demand and/or performance consideration.

The dummy gate structure 134 includes a dummy gate dielectric layer 136 and a dummy gate electrode layer 138 formed over the dummy gate dielectric layer 136, as shown in FIGS. 1K and 1K-1, in accordance with some embodiments. In some embodiments, the dummy gate dielectric layer 136 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 138 is made of semiconductor material such as polysilicon and/or poly-silicon germanium. In some embodiments, the dummy gate electrode layer 138 is made of a conductive material such as metallic nitrides, metallic silicides, metals, and/or a combination thereof. In some embodiments, the material for the dummy gate electrode layer 138 is formed using CVD, another suitable technique, and/or a combination thereof.

In some embodiments, the formation of the dummy gate structure 134 includes depositing a dielectric material for the dummy gate dielectric layer 136 over the semiconductor structure 100, depositing a material for the dummy gate electrode layer 138 over the dielectric material, planarizing the material for the dummy gate electrode layer 138, and patterning the dielectric material and the material for the dummy gate electrode layer 138 into the dummy gate structure 134.

The patterning process includes forming a patterned hard mask layer (not shown) over the material for the dummy gate electrode layer 138, in accordance with some embodiments. The hard mask layer corresponds to and overlaps the channel regions of the semiconductor fin structures 104, in accordance with some embodiments. In some embodiments, the patterned hard mask layer is made of one or more dielectric materials such as nitride (such as silicon nitride) and/or oxide (such as silicon oxide). The material for the dummy gate electrode layer 138 and dielectric material, uncovered by the patterned hard mask layer, are etched away until the source/drain regions of the semiconductor fin structures 104 are exposed, in accordance with some embodiments.

The gate spacer layers 140 are then formed on the opposite sides of the dummy gate structure 134, as shown in FIGS. 1K and 1K-2, in accordance with some embodiments. The gate spacer layers 140 are used to offset the subsequently formed source/drain features and separate the source/drain features from the gate structure, in accordance with some embodiments. In some embodiments, the gate spacer layers 140 are made of dielectric material, such as a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 140 includes depositing a dielectric material for the gate spacer layers 140 over the semiconductor structure 100. The deposition processes may be ALD, CVD (such as LPCVD, PECVD, HDP-CVD, HARP, and FCVD), another suitable method, and/or a combination thereof. Afterward, an etching process is performed to remove portions of the dielectric material for the gate spacer layers 140 formed along the upper surfaces of the dummy gate structure 134, the semiconductor fin structures 104 and the semiconductor capping layers 122 and the upper surfaces and the sidewalls of the dielectric fin structures 130, in accordance with some embodiments. The etching process may be an anisotropic etching process such as dry plasma etching. In some embodiments, the etching processes are performed without an additional photolithography process. Remaining portions of the dielectric material on the sidewalls of the dummy gate structure 134 serve as the gate spacer layers 140, in accordance with some embodiments.

FIGS. 1L-1, 1L-2 and 1L-3 are cross-sectional views of the semiconductor structure 100 after the formation of source/drain recesses 142 and notches 144 and 145, in which FIG. 1L-1 corresponds to Cross-section I-I, FIG. 1L-2 corresponds to Cross-section II-II, and FIG. 1L-3 corresponds to Cross-section III-III, in accordance with some embodiments. One or more etching processes are performed to recess the source/drain regions of the semiconductor fin structures 104, the dielectric liner 114, and the semiconductor capping layers 122, thereby forming source/drain recesses 142, as shown in FIG. 1L-3, in accordance with some embodiments. The etching process is performed until the lower fin elements 104L and the isolation structure 120 are exposed, in accordance with some embodiments. In some embodiments, the source/drain recesses 142 expose the sidewalls of the lining layers 124 of the dielectric fin structures 130, in accordance with some embodiments.

The etching process may be an anisotropic etching process such as dry plasma etching. The gate spacer layers 140 and the dummy gate structure 134 may serve as etch masks such that the source/drain recesses 142 are formed self-aligned opposite sides of the dummy gate structure 134, in accordance with some embodiments. In some embodiments, the etching process is performed without the need for an additional photolithography process.

The protection layers 128 may protect the underlying lining layers 124 and the fill layers 126 from being recessed, in accordance with some embodiments. In some embodiments, the portion of the protection layers 128 uncovered by the dummy gate structure 134 and the gate spacer layers 140 are slightly etched or remain substantially unetched. In alternative embodiments, the portion of the protection layers 128 uncovered by the dummy gate structure 134 and the gate spacer layers 140 may be partially recessed or entirely removed.

In some embodiments, during the etching process to form the source/drain recesses 142, the lining layer 124 is also exposed to the etchant. As discussed above, the lining layer 124 has a higher carbon concentration at the interface between the semiconductor capping layer 122 and the lining layer 124 (e.g., on a side of the lining layer 124 facing the source/drain recesses 142), thereby enhancing the etching resistance. The higher etching resistance may reduce the consumption of the lining layers 124 of the dielectric fin structures 130 and prevent/reduce damage to the fill layer 126, thereby prevent/reduce collapsing, necking and/or wiggling of the dielectric fin structures 130 and/or prevent the increase in the difficulty of subsequent processes.

Afterward, an etching process is performed to laterally recess, from the source/drain recesses 142 toward the channel region, the first semiconductor layers 106 of the semiconductor fin structures 104 to form notches 144 and laterally recess the semiconductor capping layers 122 and the dielectric liner 114 to form notches 145, as shown in FIG. 1L-2, in accordance with some embodiments. In some embodiments, the etching process is an isotropic etching such as dry chemical etching, remote plasma etching, wet chemical etching, another suitable technique, and/or a combination thereof.

The notches 144 are formed between adjacent second semiconductor layers 108 and between the lowermost second semiconductor layer 108 and the lower fin element 104L, in accordance with some embodiments. The notches 145 are formed between the dielectric fin structures 130 and the second semiconductor layers 108 of the semiconductor fin structures 104, in accordance with some embodiments. In some embodiments, the notches 144 and the notches 145 are connected to each other. In some embodiments, the notches 144 and the notches 145 are located directly below the gate spacer layers 140.

In some embodiments, during the etching process to form the notches 144 and the notches 145, the lining layers 124 are also exposed to the etchants. As discussed above, the lining layer 124 has a higher carbon concentration at the interface between the semiconductor capping layer 122 and the lining layer 124 (e.g., on a side of the lining layer 124 facing the source/drain recesses 142), thereby enhancing the etching resistance. The higher etching resistance may reduce the consumption of the lining layers 124 of the dielectric fin structures 130 and prevent/reduce damage to the fill layer 126, thereby prevent/reduce collapsing, necking and/or wiggling of the dielectric fin structures 130 and/or prevent the increase in the difficulty of subsequent processes.

Figures 1, 1M, 2, 3:
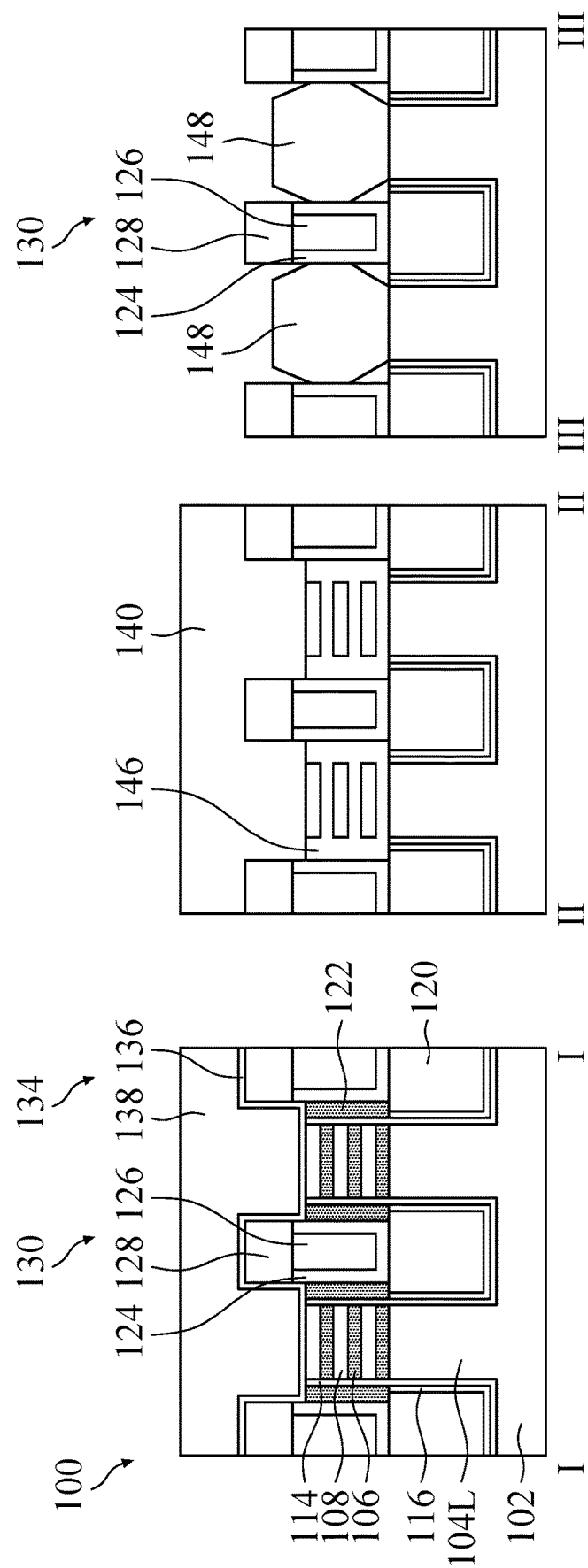

FIGS. 1M-1, 1M-2 and 1M-3 are cross-sectional views of the semiconductor structure 100 after the formation of inner spacer layers 146 and source/drain features 148, in which FIG. 1M-1 corresponds to Cross-section I-I, FIG. 1M-2 corresponds to Cross-section II-II, and FIG. 1M-3 corresponds to Cross-section III-III, in accordance with some embodiments. Inner spacer layers 146 are formed on the exposed sidewalls of the first semiconductor layers 106 and semiconductor capping layers 122 in the notches 144 and 145, as shown in FIG. 1M-2, in accordance with some embodiments. In some embodiments, the inner spacer layers 146 are formed directly below the gate spacer layers 140, in accordance with some embodiments. The inner spacer layers 146 interpose subsequently formed source/drain features and gate stack to avoid the source/drain features and the gate stack from being in direct contact and are configured to reduce the parasitic capacitance between the gate stack and the source/drain features (e.g., Cgs and Cgd), in accordance with some embodiments.

In some embodiments, the inner spacer layers 146 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 146 are made of low-k dielectric materials. For example, the dielectric constant of the inner spacer layers 146 may be lower than a k-value of silicon oxide (SiO), such as lower than 4.2, equal to or lower than about 3.9, such as in a range of about 3.5 to about 3.9.

The formation of the inner spacer layers 146 includes depositing a dielectric material for the inner spacer layers 146 over the semiconductor structure 100 to overfill the notches 144 and 145, and then etching back the dielectric material to remove the dielectric material outside the notches 144 and 145. Portions of the dielectric material remaining in the notches 144 and 145 form the inner spacer layers 146, in accordance with some embodiments. In some embodiments, the deposition process includes ALD, CVD (such as PECVD, LPCVD or HARP), another suitable technique, and/or a combination thereof. In some embodiments, the etching back process includes an anisotropic etching process such as dry plasma etching, an isotropic etching process such as dry chemical etching, remote plasma etching or wet chemical etching, and/or a combination thereof.

Source/drain features 148 are formed over the lower fin elements 104L of the semiconductor fin structures 104 in the source/drain recesses 142 using an epitaxial growth process, as shown in FIG. 1M-3, in accordance with some embodiments. The epitaxial growth process may be MBE, MOCVD, or VPE, another suitable technique, or a combination thereof. The source/drain features 148 are formed on opposite sides of the dummy gate structure 134, in accordance with some embodiments.

In some embodiments, the source/drain features 148 grown in the X direction to adjoin and contact the second semiconductor layers 108 of the semiconductor fin structures 104 and the inner spacer layers 146. In some embodiments, the source/drain features 148 grown in the Y direction to adjoin and contact the lining layer 124 of the dielectric fin structures 130. The dielectric fin structures 130 confine the lateral growth (in the Y direction) of the source/drain features 148, and thus the source/drain features 148 have a smaller dimension in the Y direction, in accordance with some embodiments.

In cases where the dielectric fin structures are not formed, the source/drain feature may have a wider dimension in the Y direction due to lateral growth, and adjacent source/drain features may even merge to each other. The source/drain feature 148 having a narrower width in the Y direction can reduce the parasitic capacitance between the gate stack and the source/drain feature, thereby enhancing the performance (e.g., speed) of the semiconductor device. In some embodiments, the top surfaces of the source/drain features 148 are located at a lower level than the top surfaces of the dielectric fin structures 130.

In some embodiments, the source/drain features 148 are made of any suitable semiconductor material for n-type semiconductor devices or p-type semiconductor devices. In some embodiments wherein the semiconductor fin structures 104 are to be formed as N-type nanostructure devices (such as n-channel GAA FETs), the source/drain features 148 are made of semiconductor material such as SiP, SiAs, SiCP, SiC, Si, GaAs, another suitable semiconductor material, or a combination thereof. In some embodiments, the source/drain features 148 are doped with the n-type dopant during the epitaxial growth process. For example, the n-type dopant may be phosphorous (P) or arsenic (As). For example, the source/drain features 148 may be the epitaxially grown Si doped with phosphorous to form silicon:phosphor (Si:P) source/drain features and/or arsenic to form silicon:arsenic (Si:As) source/drain feature.

In some embodiments in which the semiconductor fin structures 104 are to be formed as P-type nanostructure devices (such as p-channel GAA FETs), the source/drain features 148 are made of semiconductor material such as SiGe, Si, GaAs, another suitable semiconductor material, or a combination thereof. In some embodiments, the source/drain features 148 are doped with the p-type dopant during the epitaxial growth process. For example, the p-type dopant may be boron (B) or BF2. For example, the source/drain features 148 may be the epitaxially grown SiGe doped with boron (B) to form silicon germanium:boron (SiGe:B) source/drain feature.

FIGS. 1N-1, 1N-2 and 1N-3 are cross-sectional views of the semiconductor structure 100 after the formation of a contact etching stop layer (CESL) 150 and interlayer dielectric layer 152, in which FIG. 1N-1 corresponds to Cross-section I-I, FIG. 1N-2 corresponds to Cross-section II-II, and FIG. 1N-3 corresponds to Cross-section III-III, in accordance with some embodiments. A contact etching stop layer 150 is formed over the semiconductor structure 100, as shown in FIG. 1N-3, in accordance with some embodiments. In some embodiments, the contact etching stop layer 150 is made of dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 150 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 152 is formed over the contact etching stop layer 150, as shown in FIG. 1N-3, in accordance with some embodiments. In some embodiments where the number of the dummy gate structures 134 is greater than two, the interlayer dielectric layer 152 fills spaces the between the dummy gate structures 134.

In some embodiments, the interlayer dielectric layer 152 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 152 and the contact etching stop layer 150 are made of different materials and have a great difference in etching selectivity. In some embodiments, the dielectric material for the interlayer dielectric layer 152 is deposited using such as CVD (such as HDP-CVD, PECVD, HARP or FCVD), another suitable technique, and/or a combination thereof.

The dielectric materials for the contact etching stop layer 150 and the interlayer dielectric layer 152 formed above the upper surface of the dummy gate electrode layer 138 are removed using such as CMP until the dummy gate electrode layer 138 is exposed, in accordance with some embodiments. In some embodiments, the patterned hard mask layer for patterning the dummy gate structure 134 is also removed. In some embodiments, the upper surfaces of the interlayer dielectric layer 152, the dummy gate electrode layer 138 and the gate spacer layers 140 are substantially coplanar.

FIGS. 1O-1, 1O-2 and 1O-3 are cross-sectional views of the semiconductor structure 100 after the formation of a gate trench 154 and gaps 156 and 157, in which FIG. 1O-1 corresponds to Cross-section I-I, FIG. 1O-2 corresponds to Cross-section II-II, and FIG. 1O-3 corresponds to Cross-section III-III, in accordance with some embodiments. The dummy gate structure 134 is removed using one or more etching processes to form a gate trench 154, as shown in FIG. 1O-1, in accordance with some embodiments. In some embodiments, the gate trench 154 exposes the channel region of the semiconductor fin structures 104, the semiconductor capping layer 122 and the dielectric fin structures 130. In some embodiments, the gate trench 154 also exposes the inner sidewalls of the inner spacer layers 146 facing the channel region.

In some embodiments, the etching process includes one or more etching processes. For example, when the dummy gate electrode layer 138 is made of polysilicon, a wet etchant such as a tetramethylammonium hydroxide (TMAH) solution may be used to selectively remove the dummy gate electrode layer 138. For example, the dummy gate dielectric layer 136 may be thereafter removed using a plasma dry etching, a dry chemical etching, and/or a wet etching.

Afterward, an etching process is performed to remove the semiconductor capping layers 122 and the dielectric liner 114 to form gaps 157 and remove the first semiconductor layers 106 of the semiconductor fin structures 104 to form gaps 156, as shown in FIG. 1O-1, in accordance with some embodiments. The inner spacer layers 146 may be used as an etching stop layer in the etching process, which may protect the source/drain features 148 from being damaged.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. In some embodiments, the inner spacer layers 146 serve an etching stop layer in the etching process.

The gaps 156 are formed between adjacent second semiconductor layers 108 and between the lowermost second semiconductor layer 108 and the lower fin element 104L, in accordance with some embodiments. The gaps 157 are formed between the dielectric fin structures 130 and the second semiconductor layers 108 of the semiconductor fin structures 104, in accordance with some embodiments. In some embodiments, the gaps 156 and 157 also expose the inner sidewalls of the inner spacer layers 146 facing the channel region. In some embodiments, the gaps 156 and the gaps 157 are connected to each other.

In some embodiments, during the etching process to form the gaps 156 and the gaps 157, the lining layer 124 may also be exposed to the etchant. As discussed above, the lining layer 124 has a higher carbon concentration at the interface between the semiconductor capping layer 122 and the lining layer 124 (e.g., on a side of the lining layer 124 facing the gaps 156 and the gaps 157), thereby enhancing the etching resistance. The higher etching resistance may reduce the consumption of the lining layers 124 of the dielectric fin structures 130 and prevent/reduce damage to the fill layer 126, thereby prevent/reduce collapsing, necking and/or wiggling of the dielectric fin structures 130 and/or prevent the increase in the difficulty of subsequent processes.

After the etching processes, the four main surfaces of the second semiconductor layers 108 are exposed, as shown in FIG. 1O-1, in accordance with some embodiments. The exposed second semiconductor layers 108 form nanostructures that function as channel layers of the resulting semiconductor devices (e.g., nanostructure transistors such as GAA FETs), in accordance with some embodiments.

Figures 1, 1P, 2, 3:
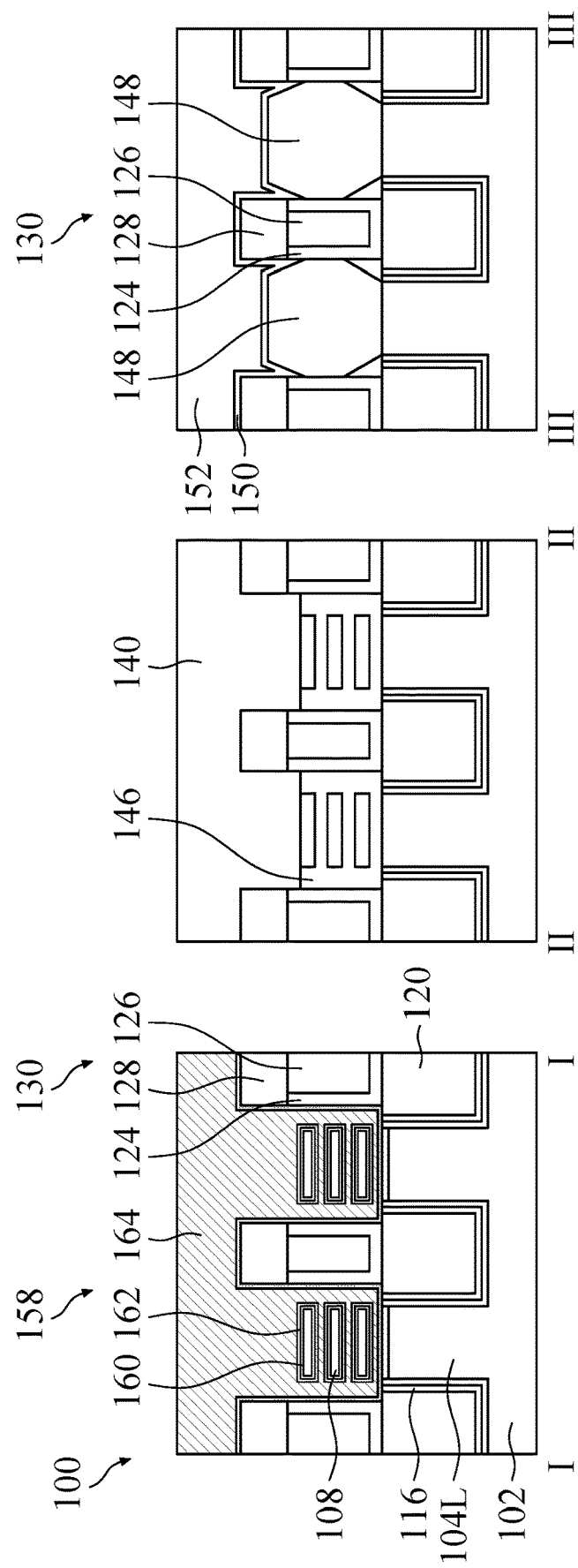

FIGS. 1P-1, 1P-2 and 1P-3 are cross-sectional views of the semiconductor structure 100 after the formation of a final gate stack 158, in which FIG. 1P-1 corresponds to Cross-section I-I, FIG. 1P-2 corresponds to Cross-section II-II, and FIG. 1P-3 corresponds to Cross-section III-III, in accordance with some embodiments. Interfacial layer 160 is formed on the exposed surfaces of the nanostructures 108 and the lower fin element 104L, as shown in FIG. 1P-1, in accordance with some embodiments. The interfacial layer 160 wraps around the nanostructures 108, in accordance with some embodiments.

In some embodiments, the interfacial layer 160 is made of a chemically formed silicon oxide. In some embodiments, the interfacial layer 160 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 104L is oxidized to form the interfacial layer 160, in accordance with some embodiments.

A gate dielectric layer 162 is formed conformally along the interfacial layer 160 to wrap around the nanostructures 108, as shown in FIG. 1P-1, in accordance with some embodiments. The gate dielectric layer 162 is also conformally formed along the upper surfaces and the sidewalls of the dielectric fin structures 130, in accordance with some embodiments. The gate dielectric layer 162 is also conformally formed along the inner sidewalls of the gate spacer layers 140 facing the channel region and the inner sidewalls of the inner spacer layers 146 facing the channel region, in accordance with some embodiments.

The gate dielectric layer 162 may be a high-k dielectric layer. In some embodiments, the high-k dielectric layer is made of a dielectric material with a high dielectric constant (k value); higher than 3.9, for example. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

A metal gate electrode layer 164 is formed over the gate dielectric layer 162 and overfills remainders of the gate trench 154 and the gaps 156 and 157, as shown in FIG. 1P-1, in accordance with some embodiments. The metal gate electrode layer 164 wraps around the nanostructures 108, in accordance with some embodiments. In some embodiments, the metal gate electrode layer 164 is made of more than one conductive material, such as a metal, metal alloy, conductive metal oxide and/or metal nitride, another suitable conductive material, and/or a combination thereof. For example, the metal gate electrode layer 164 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 164 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 164 may be formed using ALD, PVD, CVD, e-beam evaporation, or another suitable process. The metal gate electrode layer 164 may be formed separately for n-channel nanostructure transistors and p-channel nanostructure transistors, which may use different work function materials.

A planarization process such as CMP may be performed on the semiconductor structure 100 to remove the materials of the gate dielectric layer 162 and the metal gate electrode layer 164 formed above the upper surface of the interlayer dielectric layer 152, in accordance with some embodiments. After the planarization process, the upper surfaces of the metal gate electrode layer 164, the gate spacer layers 140 and the interlayer dielectric layer 152 are substantially coplanar, in accordance with some embodiments.

The interfacial layer 160, the gate dielectric layer 162 and the metal gate electrode layer 164 combine to form final gate stack 158, in accordance with some embodiments. In some embodiments, the final gate stack 158 extends in Y direction. That is, the final gate stack 158 has longitudinal axis parallel to Y direction, in accordance with some embodiments. The final gate stack 158 wraps around each of the nanostructures 108 and is interposed between the source/drain features 148, in accordance with some embodiments.

The final gate stack 158 combines with the source/drain features 148 to form a nanostructure transistor, such as an n-channel nanostructure transistor or p-channel nanostructure transistor, in accordance with some embodiments. The final gate stack 158 may engage the channel region of the nanostructures 108, such that current can flow between the source/drain features 148 during operation.

Figures 1, 1Q, 2, 3:
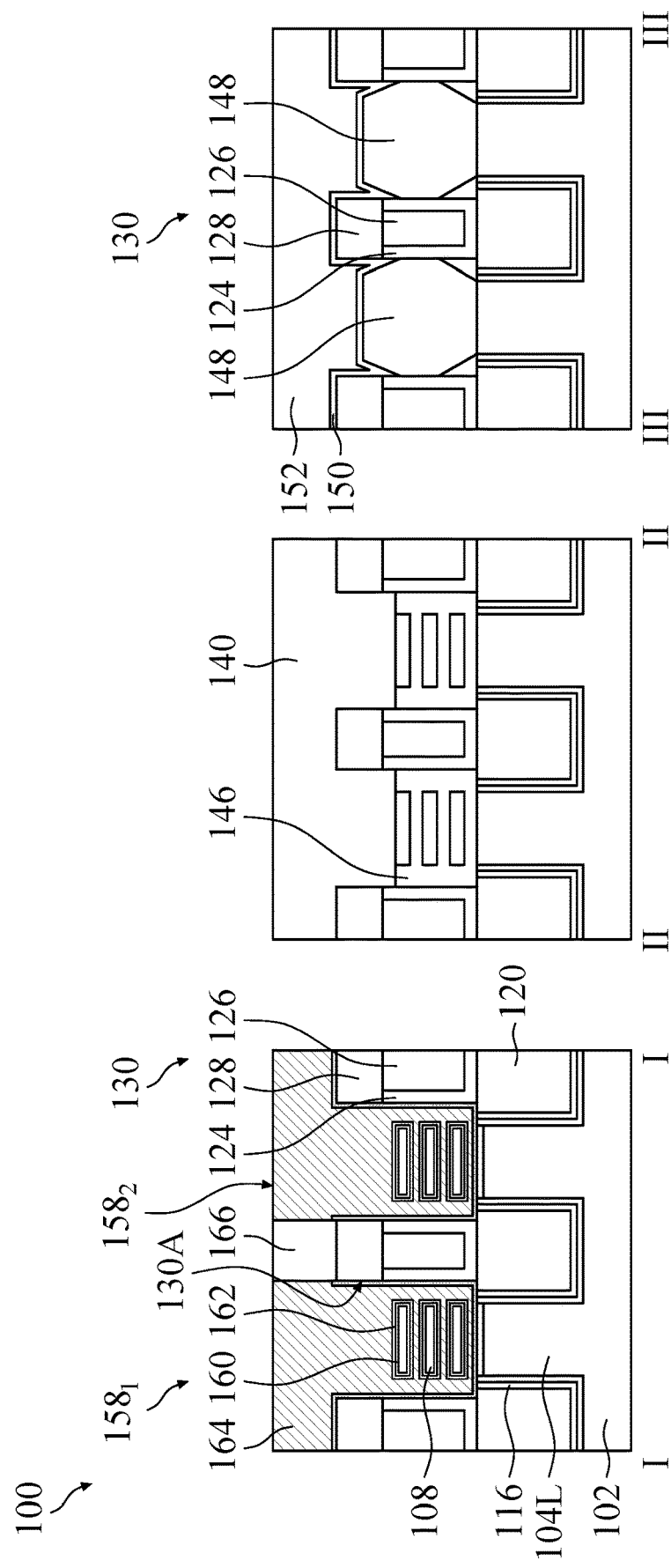
Figure 2:
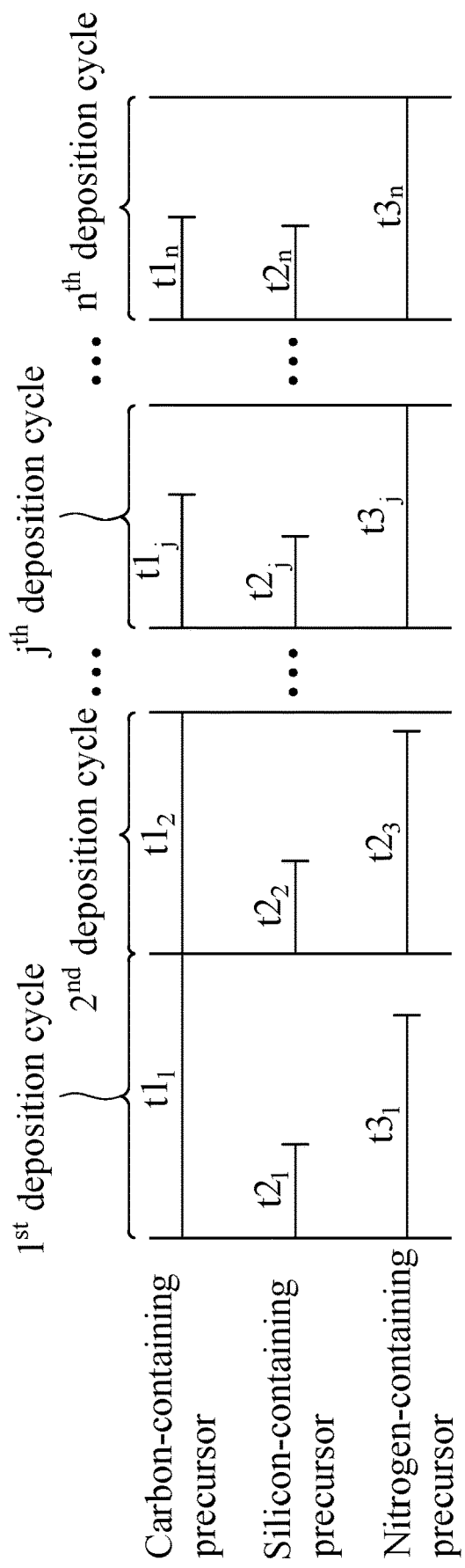

FIGS. 1Q-1, 1Q-2 and 1Q-3 are cross-sectional views of the semiconductor structure 100 after the formation of a gate isolation structure 166, in which FIG. 1Q-1 corresponds to Cross-section I-I, FIG. 1Q-2 corresponds to Cross-section II-II, and FIG. 1Q-3 corresponds to Cross-section III-III, in accordance with some embodiments. A gate isolation structure 166 is formed through the final gate stack 158, as shown in FIG. 1Q-1, in accordance with some embodiments. The gate isolation structure 166 is aligned over and lands on one 130A of the dielectric fin structures 130, in accordance with some embodiments. The final gate stack 158 is divided by the gate isolation structure 166 and the dielectric fin structure 130A into two segments 1581 and 1582, which are physically separated and electrically isolated from each other, in accordance with some embodiments.

In some embodiments, the formation of the gate isolation structure 166 includes patterning the final gate stack 158 to form an opening (where the gate isolation structure 166 is to be formed) through the final gate stack 158 and exposing the protection layer 128 of the dielectric fin structure 130A. The patterning process includes forming a patterned mask layer (such as a patterned hard mask layer or patterned photoresist layer) over the final gate stack 158 followed by an anisotropic etching process. Due to the presence of the dielectric fin structure 130A, the opening for the gate isolation structure 166 may have a small depth, thereby decreasing the process difficulty of the patterning process, e.g., overlay/CD (critical dimension) window.

In some embodiments, the formation of the gate isolation structure 166 also includes depositing a dielectric material for the gate isolation structure 166 over the semiconductor structure 100 to overfill the opening in the final gate stack 158. The gate isolation structure 166 may be bi-layered or multi-layered, for example, a lining layer and a bulk layer over the lining layer. In some embodiments, the gate isolation structure 166 is made of a dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), or a combination thereof. The deposition process may be ALD, CVD (such as LPCVD, PECVD, HDP-CVD, or HARP), another suitable technique, and/or a combination thereof.

In some embodiments, a planarization process such as CMP may be performed on the semiconductor structure 100 to remove the dielectric material formed above the upper surface of the final gate stack 158, in accordance with some embodiments. A remaining portion of the dielectric material in the opening serves as the gate isolation structure 166, in accordance with some embodiments. In some embodiments, after the planarization process, the upper surfaces of the gate isolation structure 166, the metal gate electrode layer 164, the gate spacer layers 140 and the interlayer dielectric layer 152 are substantially coplanar.

It is understood that the semiconductor structure 100 may undergo further CMOS processes to form various features over the semiconductor structure 100, such as a multilayer interconnect structure (e.g., contacts to gate and/or source/drain features, vias, lines, inter metal dielectric layers, passivation layers, etc.).

In the embodiments of the present disclosure, the lining layer 124 has a higher carbon concentration on a first side facing the semiconductor capping layer 122 and a lower carbon concentration on a second side facing the fill layer 126. As a result, the lining layer 124 has a good etching resistance on the first side and a good oxidation resistance on the second side. Therefore, the embodiments of the present disclosure may achieve the lining layer 124 with a good balance between the etching resistance and the oxidation resistance, thereby enlarging the process windows for manufacturing a semiconductor device, and increasing the manufacturing yield of the resulting semiconductor device.

FIGS. 3A-3E are schematic views exhibiting various profiles of the carbon concentration of the lining layer 124 before the anneal process of the fill layer 126, in accordance with some embodiments. The carbon concentration of the lining layer 124 decreases from the inner surface facing the semiconductor capping layer 122 (and the isolation structure 120) toward the outer surface facing the fill layer 126, as shown in FIGS. 3A-3E, in accordance with some embodiments.

The as-deposited lining layer 124 has a carbon concentration X1 at the interface between the semiconductor capping layer 122 and the lining layer 124. In some embodiments, the concentration X1 may be the maximum value of the carbon concentration of lining layer 124. In some embodiments, the concentration X1 is in a range from about 10 atomic % to about 20 atomic %. Although not shown, the carbon concentration of the lining layer 124 at the interface between the isolation structure 120 and the lining layer 124 is also substantially equal to the concentration X1. In some embodiments, if the carbon concentration X1 is lower than 10 atomic %, after the anneal process of the fill layer 126, the carbon concentration of the lining layer 124 may be too low to resist the etching process described above. In some embodiments, if the carbon concentration X1 is higher than 20 atomic %, the lining layer 124 may not have enough oxidation resistance to prevent the semiconductor capping layer 122 and the semiconductor layers 106 and 108 from being oxidized.

The as-deposited lining layer 124 has a carbon concentration X2 at the interface between the fill layer 126 and the lining layer 124. In some embodiments, the concentration X2 may be the minimum value of the carbon concentration of lining layer 124. In some embodiments, the concentration X2 is in a range from less than about 5 atomic %. In alternative embodiments, the concentration X2 may be approximately zero. In some embodiments, if the carbon concentration X2 is greater than 5 atomic %, the lining layer 124 may not have enough oxidation resistance to prevent the semiconductor capping layer 122 and the semiconductor layers 106 and 108 from being oxidized.

The carbon in the lining layer 124 before the anneal process may have various concentration profiles. For example, in some embodiments, the carbon concentration of the lining layer 124 may be linear, as shown in FIG. 3A. In some embodiments, the reduction rate of the carbon concentration is in a range from about 1%/nm to about 6.7%/nm. In some embodiments, the carbon concentration of the lining layer 124 may be represented as a parabolic function that opens upwards as shown in FIG. 3B or a parabolic function that opens downwards as shown in FIG. 3C.

In some embodiments, the carbon concentration of the lining layer 124 may be stepwise, as shown in FIGS. 3D and 3E. As shown in FIG. 3D, in some embodiments, the lining layer 124 includes a high-carbon portion with the concentration X1 and a low-carbon portion with the concentration X2, both of which are immediately connected to each other. As shown in FIG. 3E, in some embodiments, the lining layer 124 further includes several medium-carbon portions between the high-carbon portion and the low-carbon portion with the concentration between the concentration X1 to the concentration X2.

By adjusting the parameters (e.g., time periods, flow rates, and/or other applicable parameters) of the ALD process for forming the lining layer 124, the lining layer 124 may be adjusted to have various profiles of the carbon concentration, and the concentration profiles are not limited to those shown in FIGS. 3A-3E.

FIGS. 4A-4E are schematic views exhibiting various profiles of the carbon concentration of the lining layer 124 after the anneal process of the fill layer 126, in accordance with some embodiments. In some embodiments, during the anneal process, carbon in the lining layer 124 may react with the oxidizing gas and thus consumed. In some embodiments, the average carbon concentration of the lining layer 124 after the anneal process may be equal to or lower than the average carbon concentration of the lining layer 124 before the anneal process.

The lining layer 124 after the anneal process has a carbon concentration X3 at the interface between the semiconductor capping layer 122 and the lining layer 124. In some embodiments, the concentration X3 may be equal to or lower than the concentration X1 as shown in FIGS. 3A-3E. In some embodiments, the concentration X3 may be the maximum value of the carbon concentration of lining layer 124. In some embodiments, the concentration X3 is in a range from about 5 atomic % to about 20 atomic %. Although not shown, the carbon concentration of the lining layer 124 at the interface between the isolation structure 120 and the lining layer 124 is also substantially equal to the concentration X3. In some embodiments, if the carbon concentration X3 is lower than 5 atomic %, the lining layer 124 may not have enough etching resistance against the etching process described above.

The lining layer 124 after the anneal process has a carbon concentration X4 at the interface between the fill layer 126 and the lining layer 124. In some embodiments, the concentration X4 may be the minimum value of the carbon concentration of lining layer 124. In some embodiments, the concentration X4 is in a range from less than about 5%. In some embodiments, the concentration X4 may be equal to or lower than the concentration X3 as shown in FIGS. 4A-4E. In some embodiments, the concentration X4 may be approximately zero.

The carbon in the lining layer 124 after the anneal process may have various concentration profiles. For example, in some embodiments, the carbon concentration of the lining layer 124 may be linear, as shown in FIG. 4A. In some embodiments, the reduction rate of the carbon concentration is in a range from about 1%/nm to about 6.7%/nm. In some embodiments, the carbon concentration of the lining layer 124 may be represented as a parabolic function that opens upwards as shown in FIG. 4B or a parabolic function that opens downwards as shown in FIG. 4C.

Figure 4E:
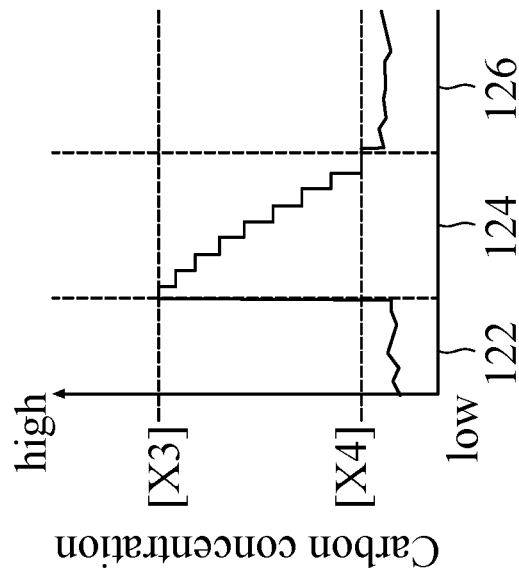
Figure 4D:
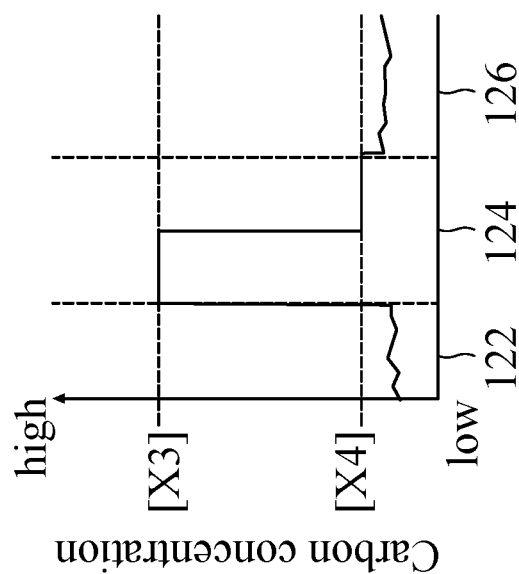

In some embodiments, the carbon concentration of the lining layer 124 may be stepwise, as shown in FIGS. 4D and 4E. As shown in FIG. 4D, in some embodiments, the lining layer 124 includes a high-carbon portion with the concentration X3 and a low-carbon portion with the concentration X4, both of which are immediately connected to each other. As shown in FIG. 4E, in some embodiments, the lining layer 124 further includes several medium-carbon portions between the high-carbon portion and the low-carbon portion with the concentration between the concentration X3 to the concentration X4.

FIGS. 5A-1 through 5D-3 are cross-sectional views illustrating the formation of a semiconductor structure 200 at various intermediate stages, in accordance with some embodiments of the disclosure. The embodiments of the FIGS. 5A-1 through 5D-3 are similar to the embodiments of the FIGS. 1A through 1Q-3, except for the steps of cutting the gate stack 158.

FIGS. 5A-1, 5A-2 and 5A-3 are cross-sectional views of the semiconductor structure 200 after an etching process, in which FIG. 5A-1 corresponds to Cross-section I-I, FIG. 5A-2 corresponds to Cross-section II-II, and FIG. 5A-3 corresponds to Cross-section III-III, in accordance with some embodiments. Continuing from FIGS. 1N-1, 1N-2 and 1N-3, a patterned mask element 202 is formed over the dummy gate structure 134 and aligned over one dielectric fin structure 130A, and an etching process is then performed using the patterned mask element 202 to recess the dummy gate electrode layer 138 until portions of the dummy gate dielectric layer 136 above the dielectric fin structure 130 are exposed, as shown in FIGS. 5A-1, in accordance with some embodiments.

In some embodiments, the patterned mask element 202 may be a patterned hard mask layer or a patterned photoresist layer. The etching process may be an anisotropic etching process such as dry plasma etching, an isotropic etching process such as dry chemical etching, remote plasma etching or wet chemical etching, and/or a combination thereof.

Figures 1, 2, 3, 5B:
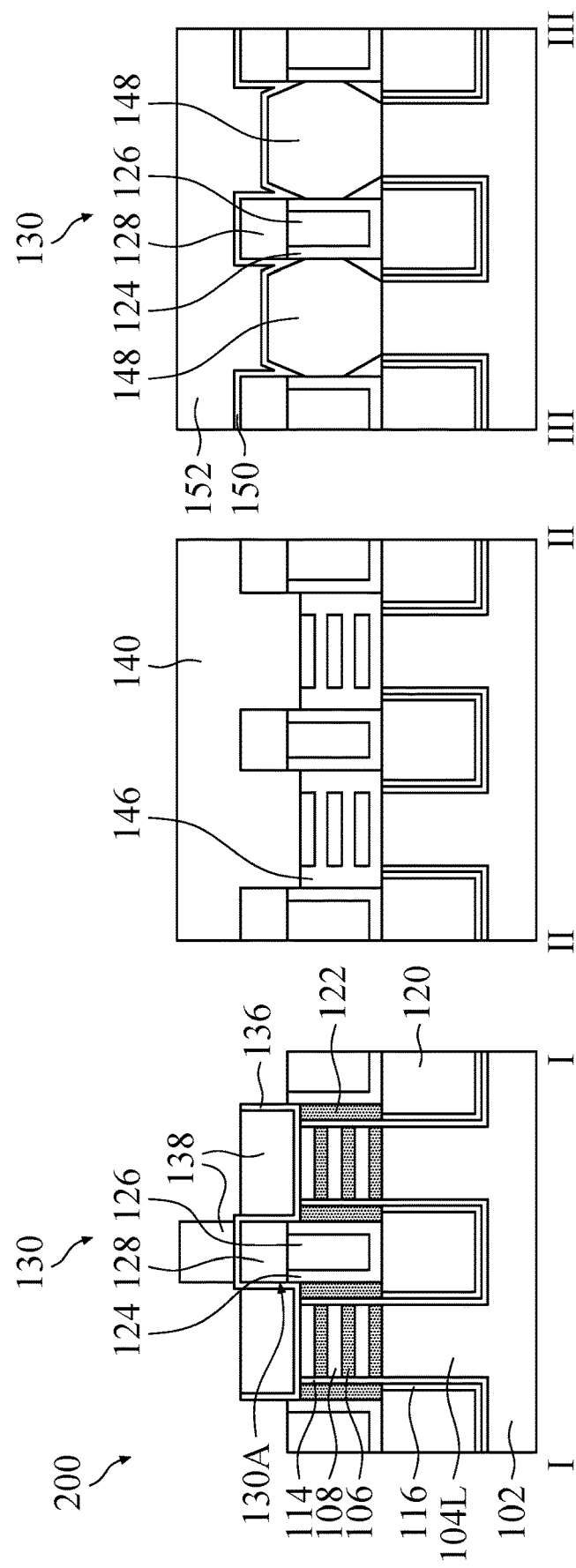

FIGS. 5B-1, 5B-2 and 5B-3 are cross-sectional views of the semiconductor structure 200 after an etching process, in which FIG. 5B-1 corresponds to Cross-section I-I, FIG. 5B-2 corresponds to Cross-section II-II, and FIG. 5B-3 corresponds to Cross-section III-III, in accordance with some embodiments. An etching process is performed to remove the portions of the dummy gate dielectric layer 136 above the dielectric fin structure 130 to expose the protection layers 128 of the dielectric fin structures 130, in accordance with some embodiments. The etching process further removes the protection layers 128 of the dielectric fin structures 130 uncovered by the patterned mask element 202 until the lining layers 124 and the fill layers 126 of the dielectric fin structures 130 are exposed, as shown in FIG. 5B-1, in accordance with some embodiments.

The etching process may be an anisotropic etching process such as dry plasma etching, an isotropic etching process such as dry chemical etching, remote plasma etching or wet chemical etching, and/or a combination thereof. The patterned mask element 202 may be removed in the etching process or by an additional process (such as an ashing process).

FIGS. 5C-1, 5C-2 and 5C-3 are cross-sectional views of the semiconductor structure 200 after the formation of a gate trench 154 and gaps 156 and 157, in which FIG. 5C-1 corresponds to Cross-section I-I, FIG. 5C-2 corresponds to Cross-section II-II, and FIG. 5C-3 corresponds to Cross-section III-III, in accordance with some embodiments. The steps described above with respect to FIGS. 1O-1, 1O-2 and 1O-3 are performed to remove the dummy gate structure 134, the semiconductor capping layers 122, the dielectric liner 114, and the first semiconductor layers 106 of the semiconductor fin structures 104, thereby forming gate trench 154 and gaps 156 and 157, in accordance with some embodiments.

FIGS. 5D-1, 5D-2 and 5D-3 are cross-sectional views of the semiconductor structure 200 after the formation of final gate stack 1581 and 1582, in which FIG. 5D-1 corresponds to Cross-section I-I, FIG. 5D-2 corresponds to Cross-section II-II, and FIG. 5D-3 corresponds to Cross-section III-III, in accordance with some embodiments. The steps described above with respect to FIGS. 1P-1, 1P-2 and 1P-3 are performed to form a final gate stack 158 including an interfacial layer 160, a gate dielectric layer 162 and a metal gate electrode layer 164, in accordance with some embodiments.

A planarization process such as CMP may be performed to remove the materials of the gate dielectric layer 162 and the metal gate electrode layer 164 formed above the upper surface of the protection layer 128 of the dielectric fin structure 130A, in accordance with some embodiments. As a result, the final gate stack 158 is divided by the dielectric fin structure 130A into two segments 1581 and 1582 which are separated and electrically isolated from each other, as shown in FIG. 5D-1, in accordance with some embodiments. After the planarization process, the upper surfaces of the metal gate electrode layer 164, the protection layer 128, the gate spacer layers 140 and the interlayer dielectric layer 152 are substantially coplanar, in accordance with some embodiments.

FIGS. 6A and 6B-1, 6B-2 and 6B-3 are cross-sectional views illustrating the formation of a semiconductor structure 300 at various intermediate stages, in accordance with some embodiments of the disclosure. The embodiments of the FIGS. 6A and 6B-1, 6B-2 and 6B-3 are similar to the embodiments of the FIGS. 1A through 1Q-3, except for a portion of the protection layer 128 nested within the lining layer 124.

Figure 6A:
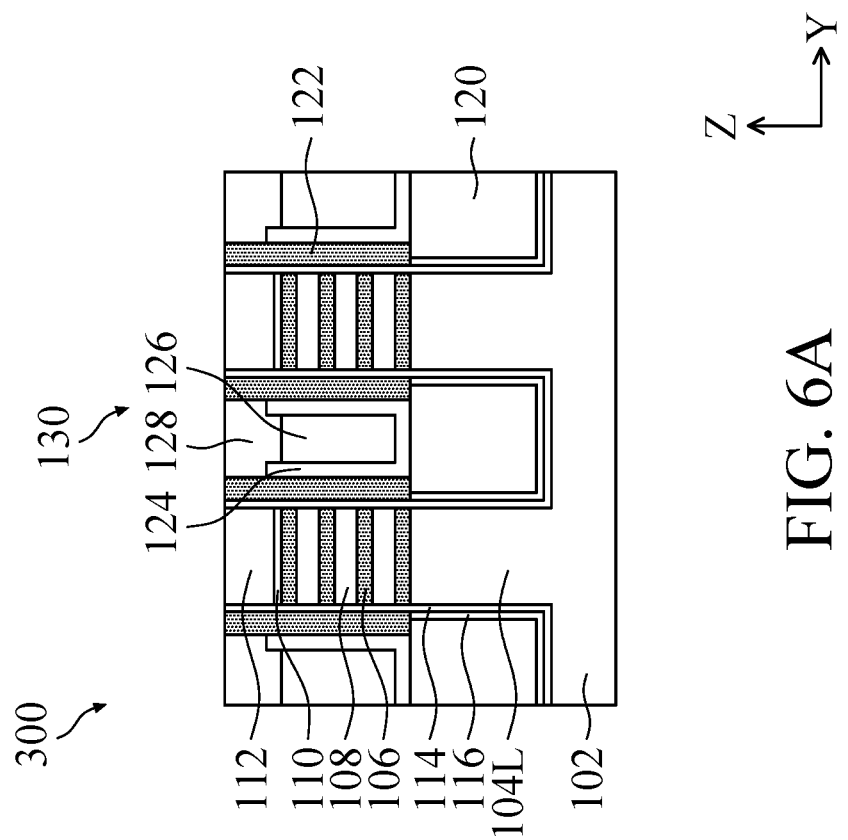

FIG. 6A is a cross-sectional view of the semiconductor structure 300 corresponding to a plane Y-Z after the formation of protection layers 128, in accordance with some embodiments. Continuing from FIG. 1H, the lining layer 124 and the fill layer 126 are etched to form recesses (in which the protection layers 128 are to be formed) between the semiconductor capping layers 122, in accordance with some embodiments. The upper surfaces of the etched lining layer 124 are located at a higher level than the upper surface of the etched fill layer 126, which may improve the gap-fill window of the protection layers 128, in accordance with some embodiments. Protection layers 128 are then formed in the recesses over the etched lining layer 124 and the etched fill layer 126, as shown in FIG. 6A, in accordance with some embodiments.

In some embodiments, the protection layer 128 includes a lower portion nested within the lining layer 124 and an upper portion covering the upper surfaces of the lining layer 124. In some embodiments, the upper portion of the protection layer 128 is wider in Y direction than the lower portion of the protection layer 128.

Figures 1, 2, 3, 6B:
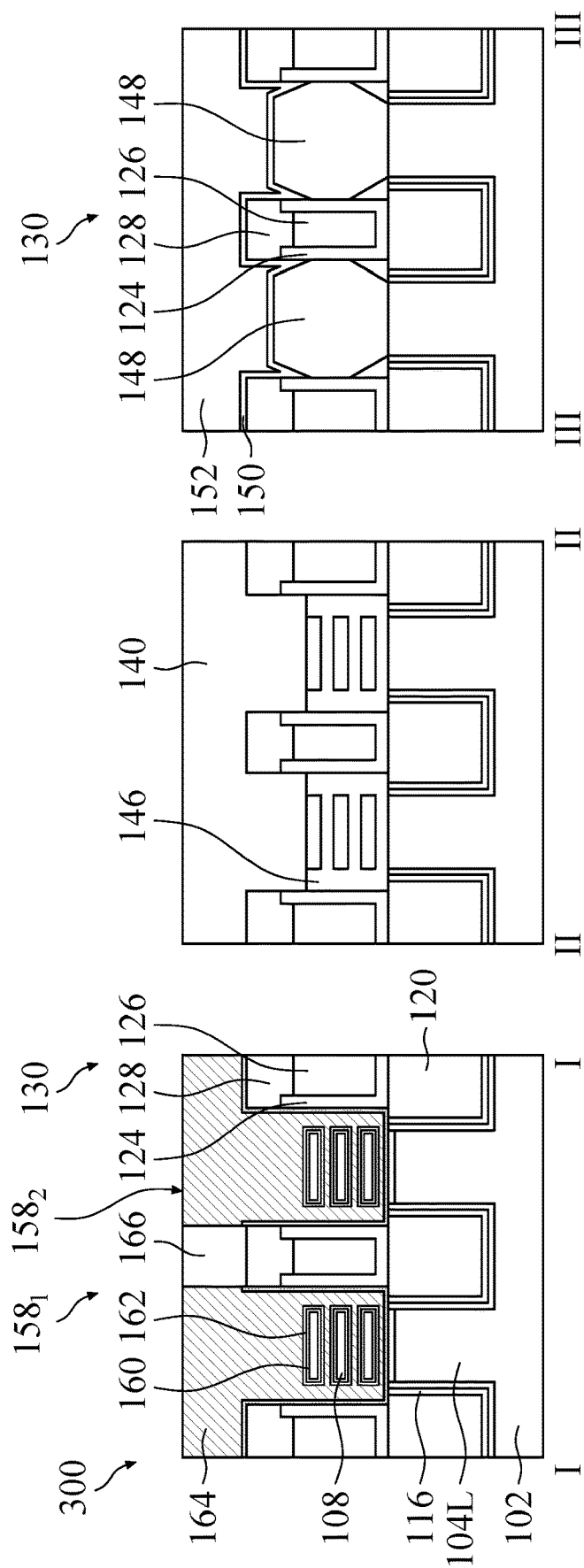

FIGS. 6B-1, 6B-2 and 6B-3 are cross-sectional views of the semiconductor structure 300 after the formation of a gate isolation structure 166, in which FIG. 6B-1 corresponds to Cross-section I-I, FIG. 6B-2 corresponds to Cross-section II-II, and FIG. 6B-3 corresponds to Cross-section III-III, in accordance with some embodiments. The steps described above with respect to FIGS. 1J through 1Q-1, 1Q-2 and 1Q-3 are performed to form source/drain features 148, inner spacer layers 146, a contact etching stop layer 150, an interlayer dielectric layer 152, final gate stacks 1581 and 1582, and a gate isolation structure 166, in accordance with some embodiments.

FIGS. 7A-1 through 7B-3 are cross-sectional views illustrating the formation of a semiconductor structure 400 at various intermediate stages, in accordance with some embodiments of the disclosure. The embodiments of the FIGS. 7A-1 through 7B-3 are similar to the embodiments of the FIGS. 1A through 1Q-3, except that the dielectric fin structure 130 is partially removed in the etching process for forming the source/drain recesses 142.

FIGS. 7A-1, 7A-2 and 7A-3 are cross-sectional views of the semiconductor structure 400 after the formation of source/drain recesses 142 and notches 144 and 145, in which FIG. 7A-1 corresponds to Cross-section I-I, FIG. 7A-2 corresponds to Cross-section II-II, and FIG. 7A-3 corresponds to Cross-section III-III, in accordance with some embodiments. Continuing from FIGS. 1K-1, 1K-2 and 1K-3, an etching process is performed to recess the source/drain regions of the semiconductor fin structures 104, the dielectric liner 114, and the semiconductor capping layers 122, thereby forming source/drain recesses 142, as shown in FIG. 7A-3, in accordance with some embodiments.

During the etching process, the protection layers 128 of the dielectric fin structures 130 are also removed, thereby exposing the lining layers 124 and the fill layer 126 of the dielectric fin structures 130, in accordance with some embodiments. Afterward, an etching process is performed to laterally recess the first semiconductor layers 106 of the semiconductor fin structures 104 to form notches 144 and laterally recess the semiconductor capping layers 122 and the dielectric liner 114 to form notches 145, in accordance with some embodiments.

FIGS. 7B-1, 7B-2 and 7B-3 are cross-sectional views of the semiconductor structure 400 after the formation of a gate isolation structure 166, in which FIG. 7B-1 corresponds to Cross-section I-I, FIG. 7B-2 corresponds to Cross-section II-II, and FIG. 7B-3 corresponds to Cross-section III-III, in accordance with some embodiments. The steps described above with respect to FIGS. 1M-1 through 1Q-1, 1Q-2 and 1Q-3 are performed to form source/drain features 148, inner spacer layers 146, a contact etching stop layer 150, an interlayer dielectric layer 152, final gate stacks 1581 and 1582, and a gate isolation structure 166, in accordance with some embodiments.

As described above, the aspect of the present disclosure is directed to a semiconductor structure having a dielectric fin structure 130. The dielectric fin structure 130 includes the lining layer 124 and a fill layer 126 nested within the lining layer 124. The carbon concentration of the lining layer 124 decreases from a first side facing the source/drain feature 148 (or the inner spacer layer 146 or the final gate stack 158) toward a second side facing the fill layer 126. As a result, the lining layer 124 has a good etching resistance on the first side and a good oxidation resistance on the second side. Therefore, the process windows for manufacturing a semiconductor device may be enlarged, and the manufacturing yield of the resulting semiconductor device may be increased.

Embodiments of a semiconductor structure and the method for forming the same may be provided. The semiconductor structure may include a gate stack wrapping around nanostructures and a dielectric fin structure spaced apart from the nanostructures by the gate stack. The dielectric fin structure may include a lining layer and a fill layer nested with the lining layer, and a carbon concentration of the lining layer varies in a direction from the gate stack to the lining layer. Therefore, the lining layer may have a good balance between the etching resistance and the oxidation resistance, thereby enlarging the process windows for manufacturing a semiconductor device, and increasing the manufacturing yield of the resulting semiconductor device.

In some embodiments, a semiconductor structure is provided. The semiconductor structure includes nanostructures separated from one another and stacked over a substrate, a gate stack wrapping around the nanostructures, and a dielectric fin structure laterally spaced apart from the nanostructures by the gate stack. The dielectric fin structure comprises a lining layer and a fill layer nested within the lining layer. The lining layer is made of a carbon-containing dielectric material, and a carbon concentration of the lining layer varies in a direction from the gate stack to the lining layer.

In some embodiments, a semiconductor structure is provided. The semiconductor structure includes source/drain feature adjoining first nanostructures, a second source/drain feature adjoining second nanostructures, and a dielectric fin structure between the first source/drain feature and the second source/drain feature. The dielectric fin structure comprises a fill layer and a lining layer. The lining layer includes a first portion between the fill layer and the first source/drain feature and a second portion between the fill layer and the second source/drain feature. The lining layer contains carbon, and a carbon concentration of the first portion of the lining layer decreases from the first source/drain feature toward the fill layer.

In some embodiments, a method for forming semiconductor structure is provided. The method includes forming a first semiconductor fin structure and a second semiconductor fin structure over a substrate. The method also includes forming a lining layer to partially fill a gap between the first semiconductor fin structure and the second semiconductor fin structure. Forming the lining layer includes performing multiple deposition cycles, and each of the deposition cycles includes: introducing a carbon-containing precursor for a first time period, and introducing a silicon-containing precursor for a second time period. A ratio of the first time period to the second time period decreases as the deposition cycles proceed. The method also includes forming a fill layer over the lining layer to fill a remainder of the gap. The method also includes etching the first semiconductor fin structure to form a first source/drain recess exposing a first sidewall of the lining layer and etching the second semiconductor fin structure to form a second source/drain recess exposing a second sidewall of the lining layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first semiconductor fin structure and a second semiconductor fin structure over a substrate;
   forming a lining layer to partially fill a gap between the first semiconductor fin structure and the second semiconductor fin structure, wherein forming the lining layer comprises performing multiple deposition cycles, wherein each of the deposition cycles comprises:
      introducing a carbon-containing precursor for a first time period; and
      introducing a silicon-containing precursor for a second time period, wherein a ratio of the first time period to the second time period decreases as the deposition cycles proceed;
   forming a fill layer over the lining layer to fill a remainder of the gap; and
   etching the first semiconductor fin structure to form a first source/drain recess and etching the second semiconductor fin structure to form a second source/drain recess, wherein the first source/drain recess exposes a first sidewall of the lining layer, wherein the second source/drain recess exposes a second sidewall of the lining layer.

2. The method of claim 1, further comprising:
   forming an isolation structure to surround a lower portion of the first semiconductor fin structure and a lower portion of the second semiconductor fin structure; and
   forming a first semiconductor capping layer and a second semiconductor capping layer over an upper portion of the first semiconductor fin structure and an upper portion of the second semiconductor fin structure, respectively, wherein the lining layer is between the first semiconductor capping layer and the second semiconductor capping layer, wherein the lining layer extends over the isolation structure.

3. The method of claim 2, wherein each of the upper portion of the first semiconductor fin structure and the upper portion of the second semiconductor fin structure comprises first semiconductor layers and second semiconductor layers alternatingly stacked, and the method further comprises:
   recessing the first semiconductor capping layer and the second semiconductor capping layer and the second semiconductor layers of each of the first semiconductor fin structure and the second semiconductor fin structure to form a first notch exposing the first sidewall of the lining layer and a second notch exposing the second sidewall of the lining layer; and
   forming a first inner spacer layer in the first notch and a second inner spacer layer in the second notch.

4. The method of claim 1, wherein forming the fill layer comprises:
   depositing silicon oxide; and
   annealing the silicon oxide, wherein the lining layer is made of a carbon-containing dielectric material, wherein the lining layer has a first average concentration of carbon before annealing the silicon oxide, wherein the lining layer has a second average concentration of carbon after annealing the silicon oxide, wherein the second average concentration of carbon is lower than the first average concentration of carbon.

5. The method of claim 1, wherein carbon in the lining layer has a first concentration at a surface of the lining layer facing away from the fill layer and a second concentration at an interface between the fill layer and the lining layer, wherein the first concentration is higher than the second concentration.

6. The method of claim 5, wherein the first concentration is in a range from about 5% to about 20%, and the second concentration is less than about 5%.

7. The method of claim 5, wherein carbon in the lining layer has a third concentration at an interior of the lining layer, the third concentration being lower than the first concentration and higher than the second concentration.

8. The method of claim 1, further comprising:
recessing the fill layer; and
forming a protection layer over the fill layer and the lining layer.

9. A method for forming a semiconductor structure, comprising:
forming a first fin structure and a second fin structure over a substrate;
forming an isolation structure between the first fin structure and the second fin structure, the first fin structure and the second fin structure protruding above an upper surface of the isolation structure;
forming a lining layer over the isolation structure and along sidewalls of the first fin structure and the second fin structure, wherein the lining layer is made of a carbon-containing dielectric material, and wherein a carbon concentration of the lining layer is gradient;
forming a fill layer over the lining layer between the first fin structure and the second fin structure; and
etching the first fin structure to form a first source/drain recess and etching the second fin structure to form a second source/drain recess, wherein the first source/drain recess exposes a first sidewall of the lining layer, wherein the second source/drain recess exposes a second sidewall of the lining layer.

10. The method of claim 9, wherein the carbon concentration of the lining layer decreases as the lining layer extends away from the isolation structure.

11. The method of claim 9, wherein forming the lining layer comprises performing multiple deposition cycles, wherein each of the deposition cycles comprises:
introducing a carbon-containing precursor for a first time period; and
introducing a silicon-containing precursor for a second time period, wherein a ratio of the first time period to the second time period decreases as the deposition cycles proceed.

12. The method of claim 9, wherein carbon in the lining layer has a first concentration adjacent the isolation structure and a second concentration adjacent the filling layer, wherein the first concentration is higher than the second concentration.

13. The method of claim 12, wherein the first concentration is in a range from about 5% to about 20%, and the second concentration is less than about 5%.

14. The method of claim 9, further comprising:
forming a protection layer over the lining layer and the fill layer, wherein an upper surface of the lining layer is higher than an upper surface of the fill layer, wherein the protection layer extends over the fill layer and along sidewalls of the lining layer.

15. A method for forming a semiconductor structure, comprising:
forming a first fin structure and a second fin structure over a substrate;
forming an isolation structure between the first fin structure and the second fin structure, the first fin structure and the second fin structure protruding above an upper surface of the isolation structure;
forming a capping layer over the first fin structure and the second fin structure;
forming a lining layer over the isolation structure and along sidewalls of the capping layer over the first fin structure and the second fin structure, wherein the lining layer is made of a carbon-containing dielectric material, wherein a carbon concentration of the lining layer is highest adjacent the capping layer;
forming a fill layer over the lining layer between the first fin structure and the second fin structure;
forming a first gate structure over the first fin structure and a second gate structure over the second fin structure;
etching the capping layer and the first fin structure to form a first source/drain recess, and etching the capping layer and the second fin structure to form a second source/drain recess;
forming a first source/drain structure in the first source/drain recess and a second source/drain structure in the second source/drain recess;
removing the first gate structure and the capping layer under the first gate structure to form a third recess, and removing the second gate structure and the capping layer under the second gate structure to form a fourth recess; and
forming a first replacement gate structure in the third recess and forming a second replacement gate structure in the fourth recess.

16. The method of claim 15, wherein the first source/drain structure contacts a first sidewall of the lining layer, wherein the second source/drain structure contacts a second sidewall of the lining layer.

17. The method of claim 15, wherein the carbon concentration of the lining layer is lowest adjacent the fill layer.

18. The method of claim 15, wherein forming the lining layer comprises an atomic layer deposition process.

19. The method of claim 15, wherein the carbon concentration of the lining layer adjacent the capping layer is in a range from about 5% to about 20%, and the carbon concentration of the capping layer adjacent the fill layer is less than about 5%.

20. The method of claim 15, further comprising forming a protective layer over the lining layer and the fill layer, wherein the protective layer contacts a sidewall of the lining layer.

* * * * *